(12) United States Patent
Yamazaki et al.

(10) Patent No.: US 10,002,949 B2
(45) Date of Patent: Jun. 19, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Suzunosuke Hiraishi, Kanagawa (JP); Kengo Akimoto, Kanagawa (JP); Junichiro Sakata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 14/489,522

(22) Filed: Sep. 18, 2014

(65) Prior Publication Data
US 2015/0093853 A1 Apr. 2, 2015

Related U.S. Application Data

(63) Continuation of application No. 12/917,548, filed on Nov. 2, 2010, now Pat. No. 8,841,662.

(30) Foreign Application Priority Data

Nov. 6, 2009 (JP) ................. 2009-255272

(51) Int. Cl.
*H01L 21/02* (2006.01)
*H01L 29/66* (2006.01)
(Continued)

(52) U.S. Cl.
CPC .. *H01L 29/66969* (2013.01); *H01L 21/02164* (2013.01); *H01L 21/02178* (2013.01);
(Continued)

(58) Field of Classification Search
CPC .................... H01L 21/02565; H01L 29/66969
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Singh et al., "Effect of substrate temperature on the structure and optical properties of ZnO thin films deposited by reactive RF magnetron sputtering," Thin Solid Films, vol. 515, Issue 24, Oct. 15, 2007, pp. 8718-8722, ISSN 0040-6090; doi:10.1016/j.tsf.2007.03.168.*

(Continued)

*Primary Examiner* — Peniel M Gumedzoe
*Assistant Examiner* — Christopher Johnson
(74) *Attorney, Agent, or Firm* — Fish & Richardson P.C.

(57) ABSTRACT

An object is, in a thin film transistor including an oxide semiconductor layer, to reduce contact resistance between the oxide semiconductor layer and source and drain electrode layers electrically connected to the oxide semiconductor layer. The source and drain electrode layers have a stacked-layer structure of two or more layers in which a layer in contact with the oxide semiconductor layer is formed using a metal whose work function is lower than the work function of the oxide semiconductor layer or an alloy containing such a metal. Layers other than the layer in contact with the oxide semiconductor layer of the source and drain electrode layers are formed using an element selected (Continued)

from Al, Cr, Cu, Ta, Ti, Mo, or W, an alloy containing any of these elements as a component, an alloy containing any of these elements in combination, or the like.

20 Claims, 16 Drawing Sheets

(51) Int. Cl.
*H01L 29/786* (2006.01)
*H01L 27/12* (2006.01)

(52) U.S. Cl.
CPC .. *H01L 21/02565* (2013.01); *H01L 21/02631* (2013.01); *H01L 29/7869* (2013.01); *H01L 27/1225* (2013.01)

(56) References Cited

U.S. PATENT DOCUMENTS

| | | | |
|---|---|---|---|
| 6,242,288 B1 * | 6/2001 | Francis | H01L 21/26513 257/E21.324 |
| 6,294,274 B1 | 9/2001 | Kawazoe et al. | |
| 6,563,174 B2 | 5/2003 | Kawasaki et al. | |
| 6,596,091 B1 * | 7/2003 | Grosenbacher | B08B 9/08 134/21 |
| 6,727,522 B1 | 4/2004 | Kawasaki et al. | |
| 6,836,299 B2 | 12/2004 | Chung et al. | |
| 6,894,311 B2 | 5/2005 | Maeda et al. | |
| 6,969,889 B2 | 11/2005 | Cho et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,335,915 B2 | 2/2008 | Toyoya et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,674,650 B2 | 3/2010 | Akimoto et al. | |
| 7,732,819 B2 | 6/2010 | Akimoto et al. | |
| 7,737,438 B2 | 6/2010 | Endo et al. | |
| RE41,927 E | 11/2010 | Chung et al. | |
| 7,855,379 B2 | 12/2010 | Hayashi et al. | |
| 7,863,607 B2 | 1/2011 | Lee et al. | |
| 7,910,490 B2 | 3/2011 | Akimoto et al. | |
| 7,919,365 B2 | 4/2011 | Kim et al. | |
| 7,932,521 B2 | 4/2011 | Akimoto et al. | |
| 7,977,675 B2 | 7/2011 | Kawamura et al. | |
| 7,981,734 B2 | 7/2011 | Furuta et al. | |
| 8,017,946 B2 | 9/2011 | Yamazaki et al. | |
| 8,063,421 B2 | 11/2011 | Kang et al. | |
| 8,088,652 B2 | 1/2012 | Hayashi et al. | |
| 8,129,714 B2 | 3/2012 | Yano et al. | |
| 8,129,717 B2 | 3/2012 | Yamazaki et al. | |
| 8,148,245 B2 | 4/2012 | Ikisawa et al. | |
| 8,247,811 B2 | 8/2012 | Morosawa et al. | |
| 8,258,023 B2 | 9/2012 | Lee | |
| 8,274,077 B2 | 9/2012 | Akimoto et al. | |
| 8,384,077 B2 | 2/2013 | Yano et al. | |
| 8,395,158 B2 | 3/2013 | Yamazaki et al. | |
| 8,436,349 B2 | 5/2013 | Sano et al. | |
| 8,461,583 B2 | 6/2013 | Yano et al. | |
| 8,563,977 B2 | 10/2013 | Shimada et al. | |
| 8,723,175 B2 | 5/2014 | Yano et al. | |
| 8,785,240 B2 | 7/2014 | Watanabe | |
| 8,791,457 B2 | 7/2014 | Yano et al. | |
| 8,981,369 B2 | 3/2015 | Yano et al. | |
| 2001/0024847 A1 | 9/2001 | Snyder | |
| 2001/0046027 A1 | 11/2001 | Tai et al. | |
| 2002/0056838 A1 | 5/2002 | Ogawa | |
| 2002/0109797 A1 | 8/2002 | Chung et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0263708 A1 | 12/2004 | Cho et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0032444 A1 | 2/2008 | Wu et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0142795 A1 | 6/2008 | Ichinose et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0237600 A1 | 10/2008 | Miyazaki et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |

(56) References Cited

U.S. PATENT DOCUMENTS

| | | | |
|---|---|---|---|
| 2009/0134419 | A1 | 5/2009 | Zhou |
| 2009/0142887 | A1 | 6/2009 | Son et al. |
| 2009/0148970 | A1 | 6/2009 | Hosoya et al. |
| 2009/0152506 | A1 | 6/2009 | Umeda et al. |
| 2009/0152541 | A1 | 6/2009 | Maekawa et al. |
| 2009/0173938 | A1 | 7/2009 | Honda et al. |
| 2009/0184315 | A1 | 7/2009 | Lee et al. |
| 2009/0224238 | A1 | 9/2009 | Kim et al. |
| 2009/0239335 | A1 | 9/2009 | Akimoto et al. |
| 2009/0261325 | A1 | 10/2009 | Kawamura et al. |
| 2009/0269880 | A1 | 10/2009 | Itagaki et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0025676 | A1 | 2/2010 | Yamazaki et al. |
| 2010/0025678 | A1 | 2/2010 | Yamazaki et al. |
| 2010/0051949 | A1* | 3/2010 | Yamazaki ............ H01L 29/4908 257/57 |
| 2010/0065838 | A1 | 3/2010 | Yamazaki et al. |
| 2010/0065841 | A1* | 3/2010 | Lee .................... H01L 27/1225 257/43 |
| 2010/0065844 | A1 | 3/2010 | Tokunaga |
| 2010/0090215 | A1 | 4/2010 | Lee |
| 2010/0092800 | A1 | 4/2010 | Itagaki et al. |
| 2010/0109002 | A1 | 5/2010 | Itagaki et al. |
| 2010/0117076 | A1 | 5/2010 | Akimoto et al. |
| 2010/0136743 | A1 | 6/2010 | Akimoto et al. |
| 2010/0163867 | A1 | 7/2010 | Yamazaki et al. |
| 2010/0163868 | A1 | 7/2010 | Yamazaki et al. |
| 2010/0200857 | A1 | 8/2010 | Shimada |
| 2010/0291767 | A1* | 11/2010 | Miura .................. C23C 14/165 438/653 |
| 2011/0000533 | A1 | 1/2011 | Ohmi et al. |
| 2011/0001136 | A1 | 1/2011 | Hasegawa et al. |
| 2011/0006302 | A1 | 1/2011 | Yamazaki et al. |
| 2011/0012106 | A1 | 1/2011 | Yamazaki et al. |
| 2011/0012116 | A1 | 1/2011 | Yamazaki et al. |
| 2011/0017995 | A1 | 1/2011 | Yamazaki et al. |
| 2011/0031493 | A1 | 2/2011 | Yamazaki et al. |
| 2011/0031497 | A1 | 2/2011 | Yamazaki et al. |
| 2011/0032444 | A1 | 2/2011 | Yamazaki et al. |
| 2011/0068334 | A1 | 3/2011 | Yamazaki et al. |
| 2011/0084269 | A1 | 4/2011 | Yamazaki et al. |
| 2011/0084270 | A1 | 4/2011 | Yamazaki |
| 2011/0084272 | A1 | 4/2011 | Miyanaga et al. |
| 2011/0104851 | A1 | 5/2011 | Akimoto et al. |
| 2011/0108834 | A1 | 5/2011 | Yamazaki et al. |
| 2011/0115763 | A1 | 5/2011 | Yamazaki et al. |
| 2011/0117697 | A1 | 5/2011 | Akimoto et al. |
| 2011/0121290 | A1 | 5/2011 | Akimoto et al. |
| 2011/0163311 | A1 | 7/2011 | Akimoto et al. |
| 2011/0210325 | A1 | 9/2011 | Sakakura et al. |
| 2011/0210328 | A1 | 9/2011 | Yamazaki et al. |
| 2011/0210355 | A1 | 9/2011 | Yamazaki et al. |
| 2011/0212571 | A1 | 9/2011 | Yamazaki et al. |
| 2011/0215318 | A1 | 9/2011 | Yamazaki et al. |
| 2011/0215319 | A1 | 9/2011 | Yamazaki et al. |
| 2012/0108006 | A1 | 5/2012 | Yamazaki et al. |
| 2012/0108007 | A1 | 5/2012 | Yamazaki et al. |
| 2012/0132911 | A1 | 5/2012 | Shimada et al. |
| 2012/0319103 | A1 | 12/2012 | Lee |
| 2014/0256095 | A1 | 9/2014 | Hosoya et al. |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2219225 A | 8/2010 |
| EP | 2226847 A | 9/2010 |
| JP | 60-198861 A | 10/1985 |
| JP | 61-201772 A | 9/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-255632 A | 11/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-077050 A | 3/2001 |
| JP | 2002-026335 A | 1/2002 |
| JP | 2002-076356 A | 3/2002 |
| JP | 2002-258325 A | 9/2002 |
| JP | 2002-289859 A | 10/2002 |
| JP | 2002-305150 A | 10/2002 |
| JP | 2003-086000 A | 3/2003 |
| JP | 2003-086808 A | 3/2003 |
| JP | 2003-172949 A | 6/2003 |
| JP | 2004-103957 A | 4/2004 |
| JP | 2004-273614 A | 9/2004 |
| JP | 2004-273732 A | 9/2004 |
| JP | 2006-005115 A | 1/2006 |
| JP | 2007-073312 A | 3/2007 |
| JP | 2007-073702 A | 3/2007 |
| JP | 2007-096055 A | 4/2007 |
| JP | 2007-123555 A | 5/2007 |
| JP | 2007-123861 A | 5/2007 |
| JP | 2007-134496 A | 5/2007 |
| JP | 2007-150156 A | 6/2007 |
| JP | 2007-150158 A | 6/2007 |
| JP | 2007-157916 A | 6/2007 |
| JP | 2007-158146 A | 6/2007 |
| JP | 2007-284342 A | 11/2007 |
| JP | 2008-072025 A | 3/2008 |
| JP | 2008-219008 A | 9/2008 |
| JP | 2008-235607 A | 10/2008 |
| JP | 2008-235871 A | 10/2008 |
| JP | 2008-281988 A | 11/2008 |
| JP | 2009-021612 A | 1/2009 |
| JP | 2009-071289 A | 4/2009 |
| JP | 2009-099847 A | 5/2009 |
| JP | 2009-099944 A | 5/2009 |
| JP | 2009-117619 A | 5/2009 |
| JP | 2009-124123 A | 6/2009 |
| JP | 2009-218562 A | 9/2009 |
| JP | 2009-224479 A | 10/2009 |
| JP | 2009-260002 A | 11/2009 |
| JP | 2009-260378 A | 11/2009 |
| JP | 2010-525602 | 7/2010 |
| JP | 2010-182818 A | 8/2010 |
| KR | 2008-0095603 A | 10/2008 |
| KR | 2008-0109998 A | 12/2008 |
| TW | 200802888 | 1/2008 |
| TW | 200901528 | 1/2009 |
| TW | 200915579 | 4/2009 |
| TW | 200939470 | 9/2009 |
| TW | 200943552 | 10/2009 |
| WO | WO-2004/114391 | 12/2004 |
| WO | WO-2007/089048 | 8/2007 |
| WO | WO-2008/105347 | 9/2008 |
| WO | WO-2008/126879 | 10/2008 |
| WO | WO-2008/133456 | 11/2008 |
| WO | WO-2009/041544 | 4/2009 |
| WO | WO-2009/072533 | 6/2009 |
| WO | WO-2009/075281 | 6/2009 |
| WO | WO-2009/084537 | 7/2009 |
| WO | WO-2009/110403 | 9/2009 |

OTHER PUBLICATIONS

Shin et al., "The effect of thermal annealing sequence on amorphous InGaZnO thin film transistor with a plasma-treated source—drain structure," Thin Solid Films, vol. 517, Issue 23, Oct. 1, 2009, pp. 6349-6352, ISSN 0040-6090, http://dx.doi.org/10.1016/j.tsf.2009.02.071.*

(56) References Cited

OTHER PUBLICATIONS

Carcia et al., "A comparison of zinc oxide thin-film transistors on silicon oxide and silicon nitride gate dielectrics", Journal of Applied Physics 102, 074512 (2007); doi: http://dx.doi.org/10.1063/1.2786869.*
Taiwanese Office Action (Application No. 099137942) dated May 18, 2015.
International Search Report (Application No. PCT/JP2010/068794) dated Dec. 14, 2010.
Written Opinion (Application No. PCT/JP2010/068794) dated Dec. 14, 2010.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Na.J et al., "High field-effect mobility amorphous InGaZnO transistors with aluminum electrodes", Appl. Phys. Lett. (Applied Physics Letters) , 2008, vol. 93, No. 6, pp. 063501-1-063501-3.
Choo.D et al., "Effective barrier height and work function of Mg:Ag thin films with a low Mg concentration acting as cathodes in high-efficiency organic light emitting devices", Solid State Communications, Nov. 1, 2005, vol. 136, pp. 365-368.
Chinese Office Action (Application No. 201080050574.X) dated Jun. 13, 2014.
Japanese Office Action (Application No. 2010-242157) dated Jul. 29, 2014.
Taiwanese Office Action (Application No. 104142715) dated Oct. 31, 2016.
Chinese Office Action (Application No. 201410581750.2) dated Oct. 28, 2016.
Taiwanese Office Action (Application No. 104142715) dated Mar. 8, 2017.
Taiwanese Office Action (Application No. 106119339) dated Dec. 20, 2017.

* cited by examiner

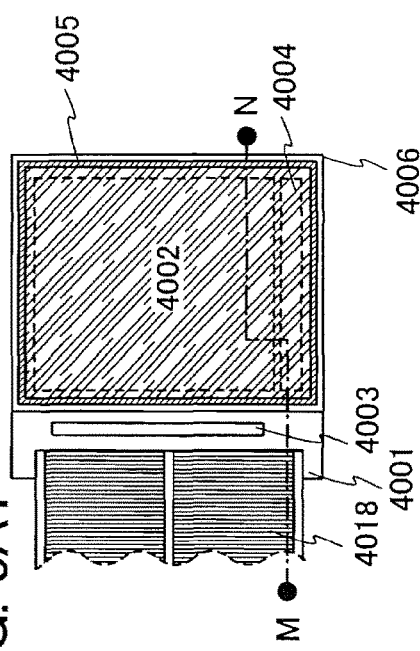
FIG. 5A1
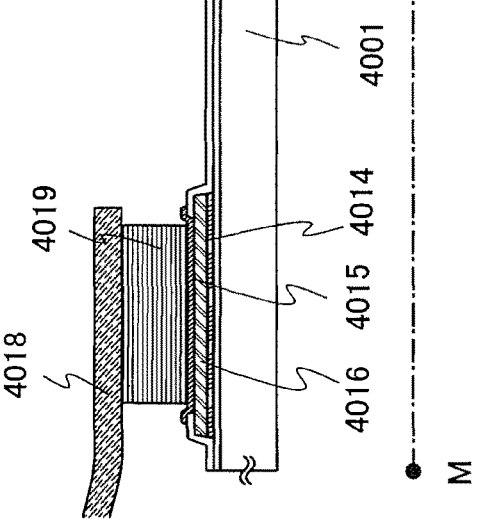
FIG. 5A2
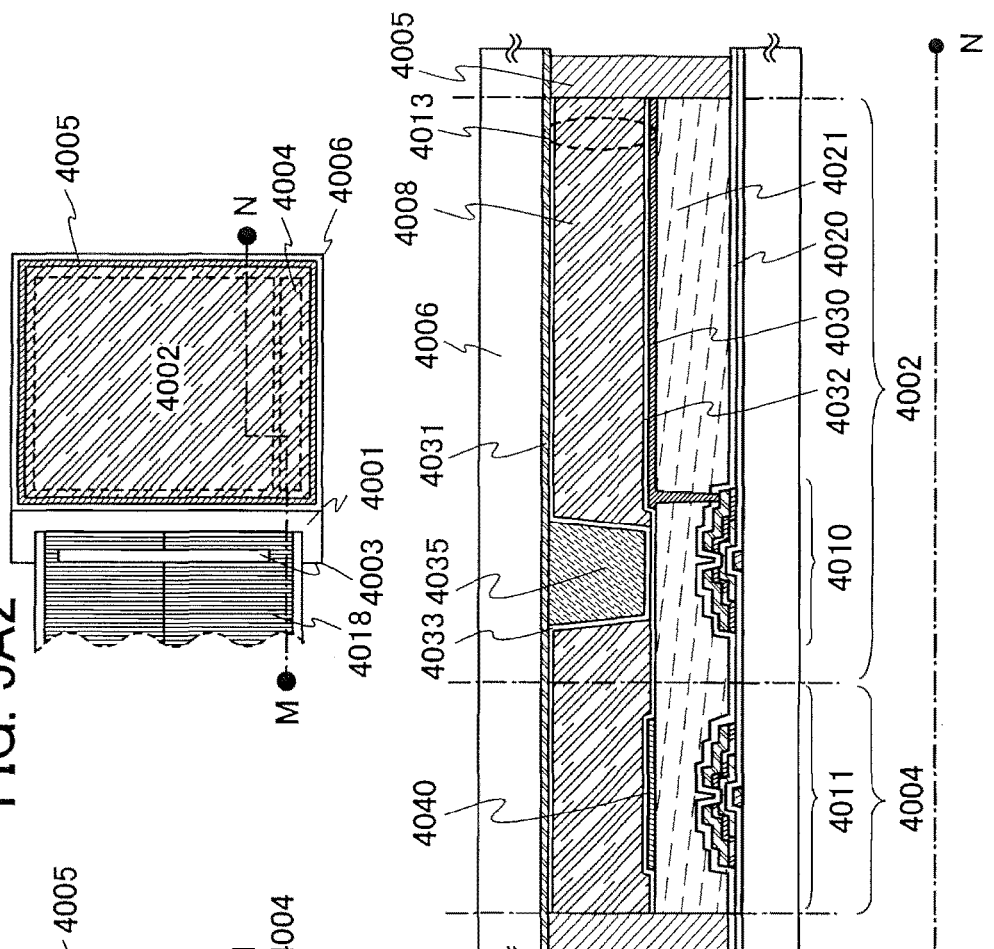
FIG. 5B

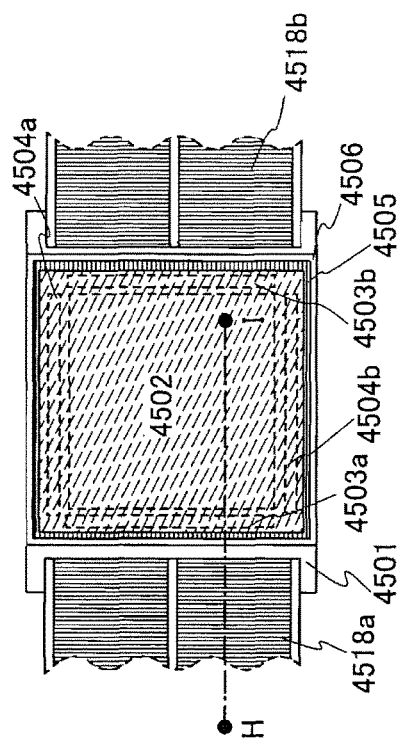
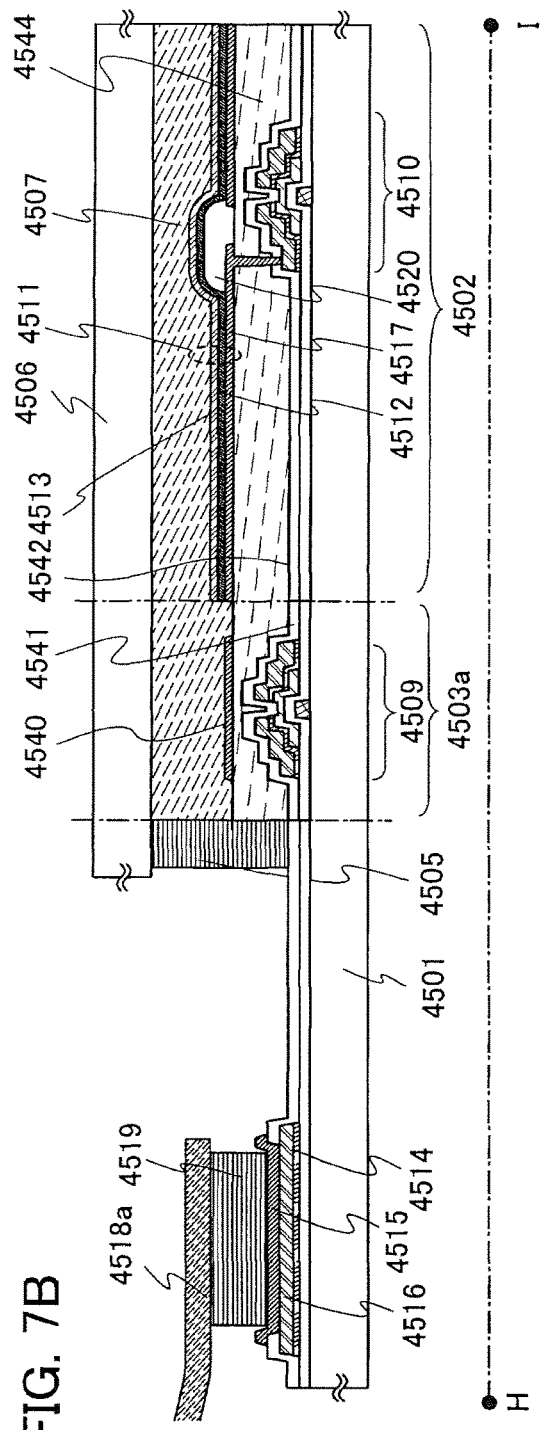
FIG. 7A
FIG. 7B

SEMICONDUCTOR DEVICE

CROSS-REFERENCE TO RELATED APPLICATIONS

This application is a continuation of U.S. application Ser. No. 12/917,548, filed Nov. 2, 2010, now allowed, which claims the benefit of a foreign priority application filed in Japan as Serial No. 2009-255272 on Nov. 6, 2009, both of which are incorporated by reference.

TECHNICAL FIELD

The present invention relates to a semiconductor device which has a circuit including a thin film transistor (hereinafter referred to as a TFT) and a manufacturing method thereof. For example, the present invention relates to an electronic device in which an electro-optical device typified by a liquid crystal display panel or a light-emitting display device including an organic light-emitting element is mounted as its component.

In this specification, a semiconductor device means all types of devices which can function by utilizing semiconductor characteristics, and an electro-optical device, semiconductor circuit, and an electronic device are all semiconductor devices.

BACKGROUND ART

In recent years, a technique for forming a thin film transistor (a TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and thin film transistors that are used as switching elements in image display devices are, in particular, urgently developed.

A wide variety of metal oxides exist and are used for various applications. Indium oxide is a well-known material and is used as a light-transmitting electrode material which is necessary for liquid crystal displays and the like. Some metal oxides have semiconductor characteristics. Examples of the metal oxides having semiconductor characteristics are tungsten oxide, tin oxide, indium oxide, zinc oxide, and the like. Thin film transistors in which a channel formation region is formed using such a metal oxide having semiconductor characteristics are already known (Patent Document 1 and Patent Document 2).

REFERENCE

Patent Document

[Patent Document 1] Japanese Published Patent Application No. 2007-123861
[Patent Document 2] Japanese Published Patent Application No. 2007-096055

DISCLOSURE OF INVENTION

An object of one embodiment of the present invention is, in a thin film transistor including an oxide semiconductor layer, to reduce contact resistance between the oxide semiconductor layer and source and drain electrode layers electrically connected to the oxide semiconductor layer.

Another object is, in a thin film transistor including an oxide semiconductor layer, to widen the choice of materials of source and drain electrode layers.

One embodiment of the present invention disclosed in this specification is a semiconductor device in which source and drain electrode layers formed over a substrate having an insulating surface have a stacked-layer structure of two or more layers, and a thin layer, in the stacked-layer structure, is formed using a metal whose work function is lower than the work function of an oxide semiconductor layer or an alloy containing such a metal. A layer in contact with the oxide semiconductor layer is formed using a metal whose work function is lower than the work function of the oxide semiconductor layer or an alloy containing such a metal, so that an optimum state of contact with the oxide semiconductor layer can be formed. Further, the choice of materials for the source and drain electrode layers can be widened. For example, a layer formed using a metal material having high heat resistance can be provided over the layer formed using a metal whose work function is lower than the work function of the oxide semiconductor layer or an alloy containing such a metal, whereby the upper limit of the temperature of a process can be raised. Tungsten or molybdenum may be used as the metal material having high heat resistance.

Another embodiment of the present invention is a semiconductor device in which source and drain electrode layers formed over a substrate having an insulating surface have a stacked-layer structure of two or more layers, and a thin layer, in the stacked-layer structure, is formed using a metal whose work function is lower than the electron affinity of the oxide semiconductor layer or an alloy containing such a metal. A layer in contact with the oxide semiconductor layer is formed using a metal whose work function is lower than the electron affinity of the oxide semiconductor layer or an alloy containing such a metal, so that an optimum state of contact with the oxide semiconductor layer can be formed. Further, the choice of materials for the source and drain electrode layers can be widened. For example, a layer formed using a metal material having high heat resistance can be provided over the layer formed using a metal whose work function is lower than the electron affinity of the oxide semiconductor layer or an alloy containing such a metal, whereby the upper limit of the temperature of a process to be performed later can be raised.

Work functions of several metal materials are listed in Table 1, but materials that are used are not limited thereto.

TABLE 1

|    | Work Function (eV) |
|----|--------------------|
| Y  | 3.3                |
| Mn | 4.1                |
| In | 4.12               |
| Al | 4.28               |
| Ti | 4.33               |
| Zn | 4.33               |
| W  | 4.55               |
| Mo | 4.6                |
| Co | 5                  |
| Ge | 5                  |
| Ni | 5.15               |

For example, the layer in contact with the oxide semiconductor layer is formed using an indium (In) layer or an alloy layer containing indium, whereby an optimum state of contact can be formed in the case where an oxide semiconductor material containing indium oxide is used as a material of the oxide semiconductor layer. In this case, the contact resistance can be reduced. It is important that a region including only indium whose work function is lower than the work function of an oxide semiconductor material containing indium oxide or a region containing a large amount of indium be intentionally provided at the interface between the oxide semiconductor layer and the source electrode layer and the interface between the oxide semiconductor layer and the drain electrode layer.

Further, zinc (Zn) may be used instead of indium. Another embodiment of the present invention is a semiconductor device in which an oxide semiconductor layer, a source electrode layer, and a drain electrode layer are provided over a substrate having an insulating surface, the source electrode layer and the drain electrode layer have a stacked-layer structure, and a layer, in the stacked-layer structure, in contact with the oxide semiconductor layer is formed using a zinc layer or an alloy layer containing zinc. The layer in contact with the oxide semiconductor layer is formed using a zinc layer or an alloy layer containing zinc, whereby an optimum state of contact can be formed in the case where an oxide semiconductor material containing zinc oxide is used as a material of the oxide semiconductor layer. For example, the contact resistance can be reduced.

Further, titanium (Ti) may be used instead of indium. Another embodiment of the present invention is a semiconductor device in which an oxide semiconductor layer, a source electrode layer, and a drain electrode layer are provided over a substrate having an insulating surface, the source electrode layer and the drain electrode layer have a stacked-layer structure, and a layer, in the stacked-layer structure, in contact with the oxide semiconductor layer is formed using a titanium layer or an alloy layer containing titanium. An optimum state of contact can be formed in the case where the layer in contact with the oxide semiconductor layer is formed using a titanium layer or an alloy layer containing titanium. For example, the contact resistance can be reduced.

Further, yttrium (Y) may be used instead of indium. Another embodiment of the present invention is a semiconductor device in which an oxide semiconductor layer, a source electrode layer, and a drain electrode layer are provided over a substrate having an insulating surface, the source electrode layer and the drain electrode layer have a stacked-layer structure, and a layer, in the stacked-layer structure, in contact with the oxide semiconductor layer is formed using an yttrium layer or an alloy layer containing yttrium. An optimum state of contact can be formed in the case where the layer in contact with the oxide semiconductor layer is formed using an yttrium layer or an alloy layer containing yttrium. For example, the contact resistance can be reduced.

Further, an indium-zinc alloy or an alloy containing gallium (Ga) (e.g., gallium nitride) may be used instead of indium. It is important that a region of such an alloy or a region mainly containing such an alloy be intentionally provided at the interface between the oxide semiconductor layer and the source electrode layer and the interface between the oxide semiconductor layer and the drain electrode layer. The region of such an alloy or the region mainly containing such an alloy can form an optimum state of contact with the oxide semiconductor layer. For example, the contact resistance can be reduced.

Layers other than the layer in contact with the oxide semiconductor layer in the stacked-layer structure of the source and drain electrode layers are formed using an element selected from aluminum (Al), chromium (Cr), copper (Cu), tantalum (Ta), titanium (Ti), molybdenum (Mo), or tungsten (W), an alloy containing any of these elements as a component, an alloy containing any of these elements in combination, or the like. Alternatively, the source and drain electrode layers can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added. In the case where the thin film transistor is used for a display panel, the aperture ratio can be improved.

Note that the source and drain electrode layers may be formed using a mixed layer of a layer containing a metal whose work function is lower than the work function of the oxide semiconductor layer or an alloy containing such a metal and a layer containing another metal. With such a structure, the contact resistance can be reduced. When a metal having high heat resistance is used as another metal, the upper limit of the temperature of a process to be performed later can be raised.

The source and drain electrode layers are provided so that the layer formed using a metal whose work function is lower than the work function of the oxide semiconductor layer or an alloy containing such a metal is in contact with the oxide semiconductor layer. The source and drain electrode layers may have a stacked-layer structure in which a layer formed using a metal having high heat resistance is further provided over the layer formed using a metal whose work function is lower than the work function of the oxide semiconductor layer or an alloy containing such a metal. Alternatively, the source and drain electrode layers may have a single-layer structure of a layer formed using a metal whose work function is lower than the work function of the oxide semiconductor layer or an alloy containing such a metal.

With the above structure, at least one of the above problems can be resolved.

It is preferable that in each of the above structures, at least one common metal element be included in one or a plurality of materials of the oxide semiconductor layer and in a material of the layer in contact with the oxide semiconductor layer in the stacked-layer structure of the source and drain electrode layers. For example, when indium is used for the material of the layer in contact with the oxide semiconductor layer in the stacked-layer structure of the source and drain electrode layers, an In—Ga—Zn—O-based non-single-crystal film, an In—Sn—Zn—O-based oxide semiconductor material, an In—Al—Zn—O-based oxide semiconductor material, an In—Zn—O-based oxide semiconductor material, an In—Sn—O-based oxide semiconductor material, or an In—O-based oxide semiconductor material is preferably used for the material of the oxide semiconductor layer.

Further, in the case where zinc is used for the material of the layer in contact with the oxide semiconductor layer in the stacked-layer structure of the source and drain electrode layers, an In—Ga—Zn—O-based non-single-crystal film, an In—Sn—Zn—O-based oxide semiconductor material, an In—Al—Zn—O-based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, a Sn—Zn—O-based oxide semiconductor material, an Al—Zn—O-based oxide semiconductor material, or a Zn—O-based oxide semiconductor material can be used.

Further, in the case where yttrium is used for the material of the layer in contact with the oxide semiconductor layer in the stacked-layer structure of the source and drain electrode layers, an In—Ga—Zn—O-based non-single-crystal film, an In—Sn—Zn—O-based oxide semiconductor material, an In—Al—Zn—O-based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, a Sn—Zn—O-based oxide semiconductor material, an Al—Zn—O-based oxide semiconductor material, a Zn—O-based oxide semiconductor material, an In—Sn—O-based oxide semiconductor material, or an In—O-based oxide semiconductor material can be used.

Further, in the case where titanium is used for the material of the layer in contact with the oxide semiconductor layer in the stacked-layer structure of the source and drain electrode layers, an In—Ga—Zn—O-based non-single-crystal film, an In—Sn—Zn—O-based oxide semiconductor material, an In—Al—Zn—O-based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, a Sn—Zn—O-based oxide semiconductor material, an Al—Zn—O-based oxide semiconductor material, or a Zn—O-based oxide semiconductor material can be used.

The materials of the oxide semiconductor layer and the layer in contact with the oxide semiconductor layer are not limited to the above oxide semiconductors and the above metals or the above alloys containing the metal. When a metal whose work function is lower than the work function of an oxide semiconductor or an alloy containing such a metal is employed in combination with the oxide semiconductor, one embodiment of the present invention can be realized.

One embodiment of the present invention can also be realized with a structure of any combination as long as the work function of a metal or an alloy containing a metal is lower than the electron affinity of an oxide semiconductor.

Another embodiment of the present invention to realize the above structure is a method for manufacturing a semiconductor device including the steps of forming a gate electrode layer over a substrate having an insulating surface; forming a gate insulating layer over the gate electrode layer; forming an oxide semiconductor layer over the gate insulating layer; forming a stacked layer of an indium layer or an alloy layer containing indium and a metal conductive layer over the oxide semiconductor layer; and selectively etching the indium layer or the alloy layer containing indium and the metal conductive layer to form source and drain electrode layers having a stacked-layer structure of an indium layer or an alloy layer containing indium and a metal conductive layer.

With the above manufacturing method, a bottom-gate thin film transistor can be manufactured.

Zinc may be used instead of indium. Another embodiment of the present invention is a method for manufacturing a semiconductor device including the steps of forming a gate electrode layer over a substrate having an insulating surface; forming a gate insulating layer over the gate electrode layer; forming an oxide semiconductor layer over the gate insulating layer; forming a stacked layer of a zinc layer or an alloy layer containing zinc and a metal conductive layer over the oxide semiconductor layer; and selectively etching the zinc layer or the alloy layer containing zinc and the metal conductive layer to form source and drain electrode layers having a stacked-layer structure of a zinc layer or an alloy layer containing zinc and a metal conductive layer.

In the case where an inverted-coplanar (also referred to as bottom-contact) thin film transistor is manufactured, a gate electrode layer is formed over a substrate having an insulating surface; a gate insulating layer is formed over the gate electrode layer; a stacked layer of a metal conductive layer and an indium layer or an alloy layer containing indium is formed over the gate insulating layer; the metal conductive layer and the indium layer or the alloy layer containing indium are selectively etched to form source and drain electrode layers having a stacked-layer structure of a metal conductive layer and an indium layer or an alloy layer containing indium; and an oxide semiconductor layer is formed over the source and drain electrode layers.

In the above manufacturing method, the indium layer or the alloy layer containing indium is formed by a sputtering method or an evaporation method. The metal conductive layer is preferably formed without exposure to air after the indium layer or the alloy layer containing indium is formed.

In the above manufacturing method, the zinc layer, the alloy layer containing zinc, the layer formed using an indium-zinc alloy, or the alloy layer containing gallium (e.g., gallium nitride) is formed by a sputtering method, an evaporation method, or an MOCVD method. After the zinc layer, the alloy layer containing zinc, the layer formed using an indium-zinc alloy, or the alloy layer containing gallium (e.g., gallium nitride) is formed, the metal conductive layer is preferably formed thereover without exposure to air, so that oxidation and increase in resistance can be prevented.

In addition, it is difficult to manufacture a sputtering target using indium. Therefore, in the case where a metal or an alloy with which it is difficult to manufacture a sputtering target such as indium is deposited, a pellet of indium is put over another metal target such as a molybdenum target or a tungsten target and successive deposition is performed by a sputtering method. In this case, the deposition can be performed in one sputtering apparatus without exposure to air. A mixed layer of indium and tungsten is formed in some cases, which depends on sputtering conditions. In addition, sputtering may be performed in the state where a plurality of indium pellets are arranged over a metal target. The pellet has a columnar shape with a diameter of 5 mm to 50 mm and a height of 2 mm to 30 mm. Note that there is no particular limitation on the shape of the pellet. The pellet can be a cube, a rectangular solid, an elliptical cylinder, or the like.

The term "successive deposition" in this specification means that during a series of a first deposition step by a sputtering method (an evaporation method, or the like) and a second deposition step by a sputtering method (an evaporation method, or the like), an atmosphere in which a substrate to be processed is disposed is not mixed with a contaminant atmosphere such as air, and is constantly controlled to be vacuum, or an inert gas atmosphere (a nitrogen atmosphere or a rare gas atmosphere). By the successive deposition, deposition can be conducted while preventing moisture or the like from being attached again to the substrate to be processed which is cleaned. A mixed layer of stacked metals is formed in some cases, which depends on sputtering conditions.

In the case where a mixed layer is formed due to sputtering conditions, the concentration distribution of stacked metals is not uniform and the concentration might have a gradient in some cases. For example, in the case where indium is deposited as a first layer on the oxide semiconductor layer and tungsten is successively deposited as a second layer on the first layer by a sputtering method, a mixed layer in which the interface between the first layer and the second layer is not clear might be formed. In this case, the concentration of indium in a region close to the oxide semiconductor layer in the mixed layer is high, and the longer the distance from the oxide semiconductor layer is, the lower the concentration of indium becomes.

At this time, when the second layer is stacked over the first layer having a thickness of greater than or equal to 1 nm and less than or equal to 50 nm, the mixed layer in which the interface between the first layer and the second layer is not clear is formed.

Performing the process from the first deposition step to the second deposition step in the same chamber is within the scope of the successive deposition in this specification.

In addition, the following is also within the scope of the successive deposition in this specification: in the case where the process from the first deposition step to the second deposition step is performed in different chambers, the substrate is transferred after the first deposition step to another chamber without exposure to air and subjected to the second deposition.

Note that between the first deposition step and the second deposition step, a substrate transfer step, an alignment step, a slow-cooling step, a step of heating or cooling the substrate to a temperature which is necessary for the second deposition step, or the like may be provided. Such a process is also within the scope of the successive deposition in this specification.

However, the case where there is a step in which liquid is used, such as a cleaning step, wet etching, or resist formation, between the first deposition step and the second deposition step is not within the scope of the successive deposition in this specification.

In a thin film transistor including an oxide semiconductor layer, the choice of materials for source and drain electrode layers can be widened, so that a thin film transistor with excellent electric characteristics and high reliability can be realized. In addition, with the use of a metal having high heat resistance, the upper limit of the temperature of a process to be performed later can be raised.

BRIEF DESCRIPTION OF DRAWINGS

FIGS. 5A1, 5A2, and 5B are top views and a cross-sectional view illustrating one embodiment of the present invention.

FIGS. 7A and 7B are a top view and a cross-sectional view illustrating one embodiment of the present invention.

BEST MODE FOR CARRYING OUT THE INVENTION

Hereinafter, embodiments of the present invention will be described in detail with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, a stacked-layer structure in which an oxide semiconductor layer and a metal whose work function is lower than the work function of the oxide semiconductor layer or an alloy containing such a metal are in contact with each other will be described.

For example, it is said that the electron affinity ($\chi$) of an In—Ga—Zn—O-based oxide semiconductor film is 4.3 eV in the case where the band gap (Eg) thereof is 3.15 eV. An impurity such as hydrogen or water is eliminated from an oxide semiconductor according to the present invention as much as possible, and the oxide semiconductor is highly purified to be an i-type semiconductor (an intrinsic semiconductor) or be close thereto. Thus, the work function of the oxide semiconductor is 5.8 eV. At this time, as a material which is used for source and drain electrode layers and whose work function is lower than 5.8 eV, yttrium, indium, aluminum, or the like can be given as shown in Table 1. Alternatively, an alloy containing a metal whose work function is lower than 5.8 eV may be used.

As an In—Sn—O-based oxide semiconductor, for example, indium tin oxide (ITO) can be given. The work function of ITO is 4.7 eV. In the case where ITO is used as a material of the source and drain electrode layers, a metal whose work function is lower than 4.7 eV such as yttrium, indium, titanium, or zinc as shown in Table 1 may be used. In particular, yttrium is preferably used because yttrium has a low work function of 3.3 eV. Alternatively, an alloy containing a metal whose work function is lower than 4.7 eV may be used.

As an oxide semiconductor, indium tin oxide containing silicon oxide (ITSO) can be given. The work function of ITSO is 4.69 eV. In the case where ITSO is used as a material of the source and drain electrode layers, a metal whose work function is lower than 4.69 eV such as yttrium, indium, titanium, or zinc as shown in Table. 1 may be used. In particular, yttrium is preferably used because yttrium has a low work function of 3.3 eV. Alternatively, an alloy containing a metal whose work function is lower than 4.7 eV may be used.

A metal whose work function is lower than the work function of an oxide semiconductor is used as described above, whereby the contact resistance between the oxide semiconductor and the metal can be small.

Figure 12:
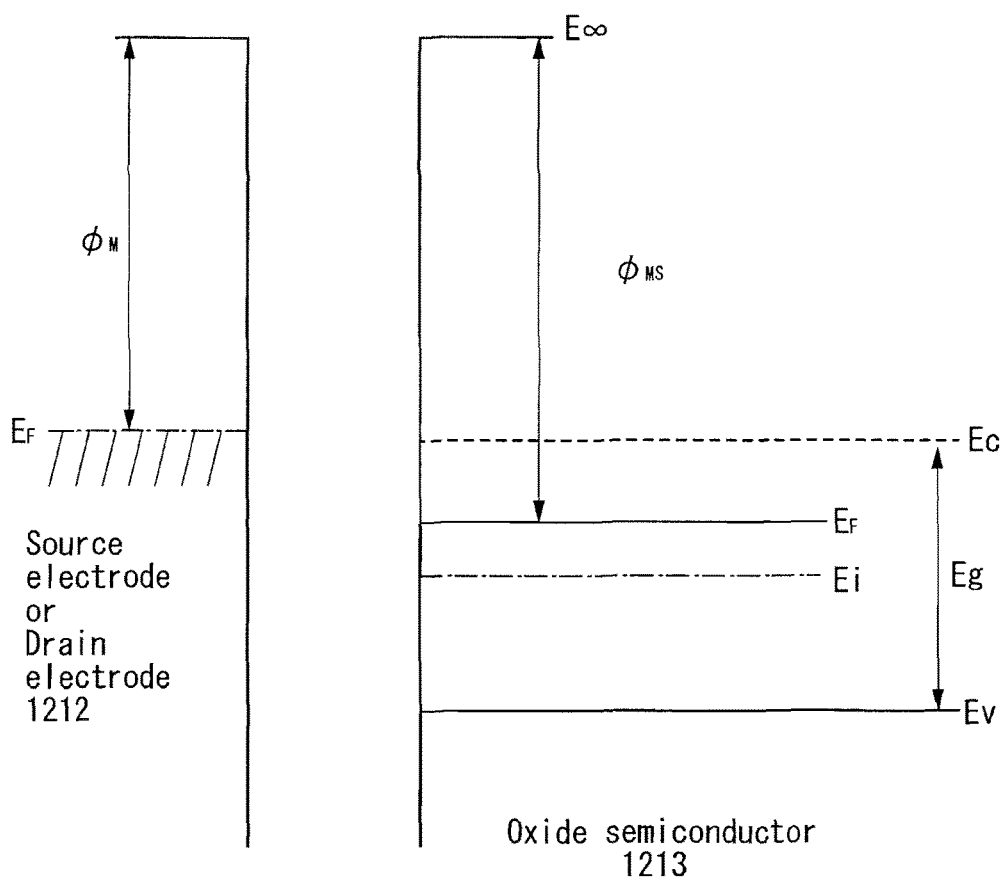
FIG. 12 is an energy band diagram showing one embodiment of the present invention.

FIG. 12 shows the relation between the work function ($\phi_M$) of source and drain electrodes 1212 (a metal in contact with an oxide semiconductor) and the work function ($\phi_{MS}$) of an oxide semiconductor 1213 before the source and drain electrodes 1212 and the oxide semiconductor 1213 are brought in contact with each other. FIG. 12 shows the case where the work function ($\phi_M$) of the source and drain electrodes 1212 is lower than the work function ($\phi_{MS}$) of the oxide semiconductor 1213.

At normal temperature, electrons in a metal are degenerated, and the Fermi level is located in the conduction band. On the other hand, a conventional oxide semiconductor is generally of n-type, and the Fermi level ($E_F$) in that case is positioned closer to the conduction band and is away from the intrinsic Fermi level ($E_i$) that is located in the middle of the band gap (Eg). Note that it is known that some hydrogen in the oxide semiconductor form a donor and might be a factor that causes an oxide semiconductor to be an n-type oxide semiconductor.

In contrast, the oxide semiconductor according to the present invention is an oxide semiconductor that is made to be an intrinsic (i-type) semiconductor or made to be a substantially intrinsic semiconductor by being highly purified by removal of hydrogen that is an n-type impurity so that an impurity other than a main component of the oxide semiconductor is prevented from being contained therein as much as possible. In other words, the oxide semiconductor according to the present invention has a feature in that it is made to be an i-type (intrinsic) semiconductor or made to be close thereto not by addition of an impurity but by being highly purified by removal of an impurity such as hydrogen or water as much as possible. As a result, the Fermi level ($E_F$) can be at the same level as the intrinsic Fermi level ($E_i$).

Figure 16A:
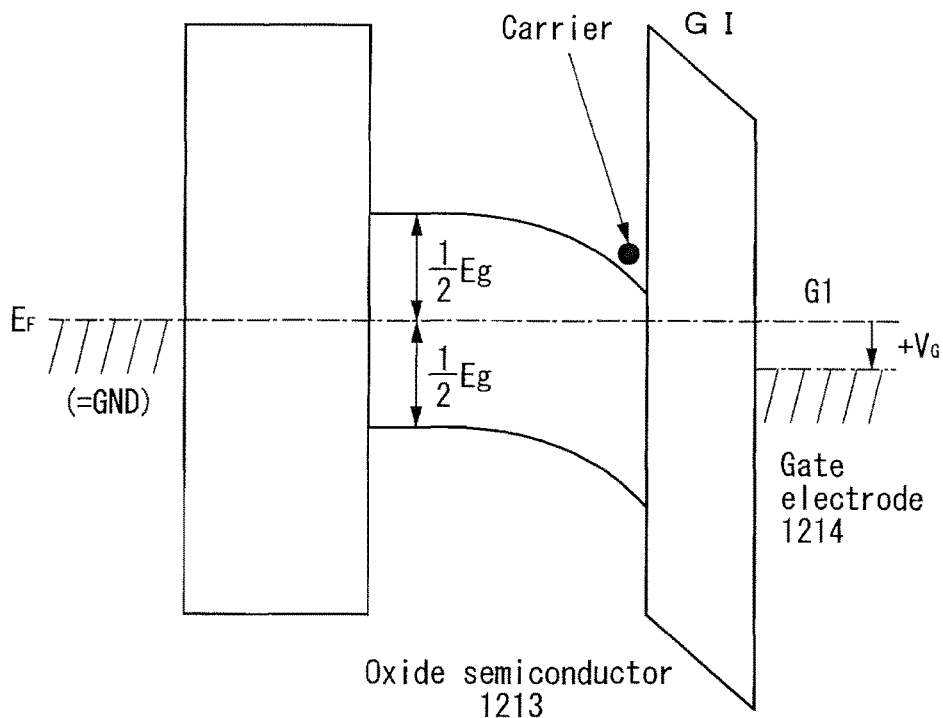
FIGS. 16A and 16B are energy band diagrams of a cross section showing one embodiment of the present invention.
Figure 16B:
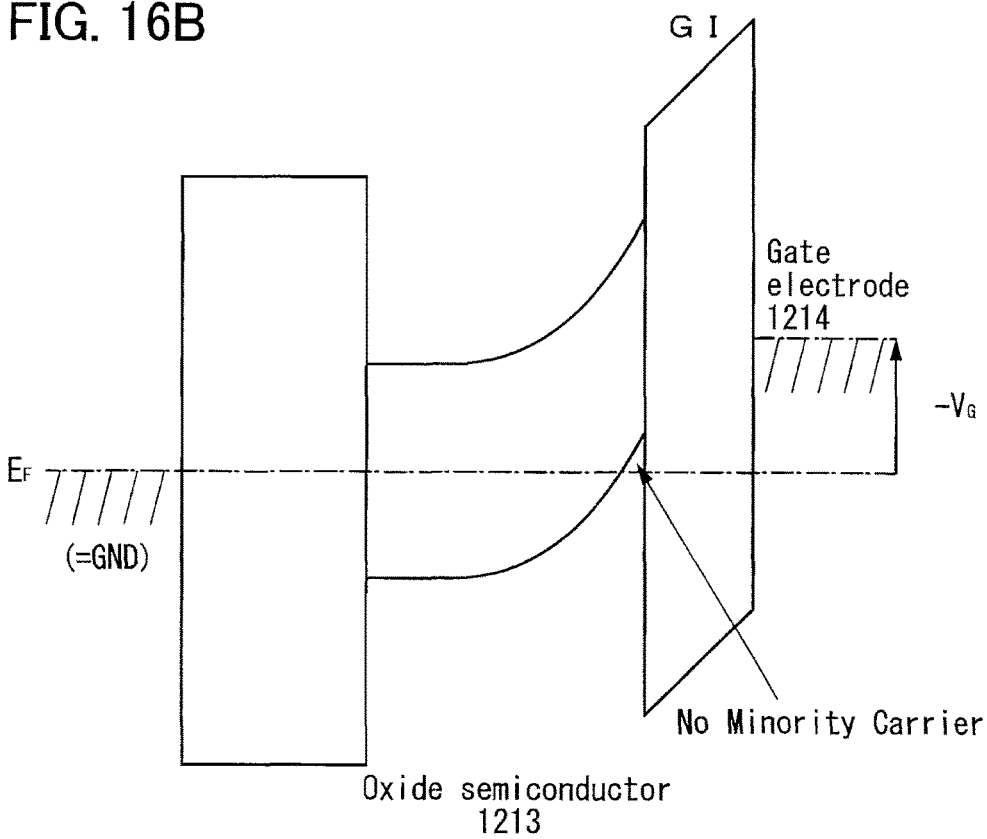

FIGS. 16A and 16B are energy band diagrams (schematic diagrams) of a cross section of the oxide semiconductor 1213 and a gate electrode 1214 (i.e., a cross section perpendicular to a cross section of the source and the drain which will be described later) according to the present invention. FIG. 16A shows a state where a positive potential ($+V_G$) is applied to the gate electrode 1214, that is, a case where the thin film transistor is in an on state where carriers (electrons) flow between the source electrode and the drain electrode. FIG. 16B shows a state where a negative potential ($-V_G$) is applied to the gate electrode 1214, that is, a case where the thin film transistor is in an off state (where minority carriers do not flow). Note that GI denotes a gate insulating film.

Figure 13A:
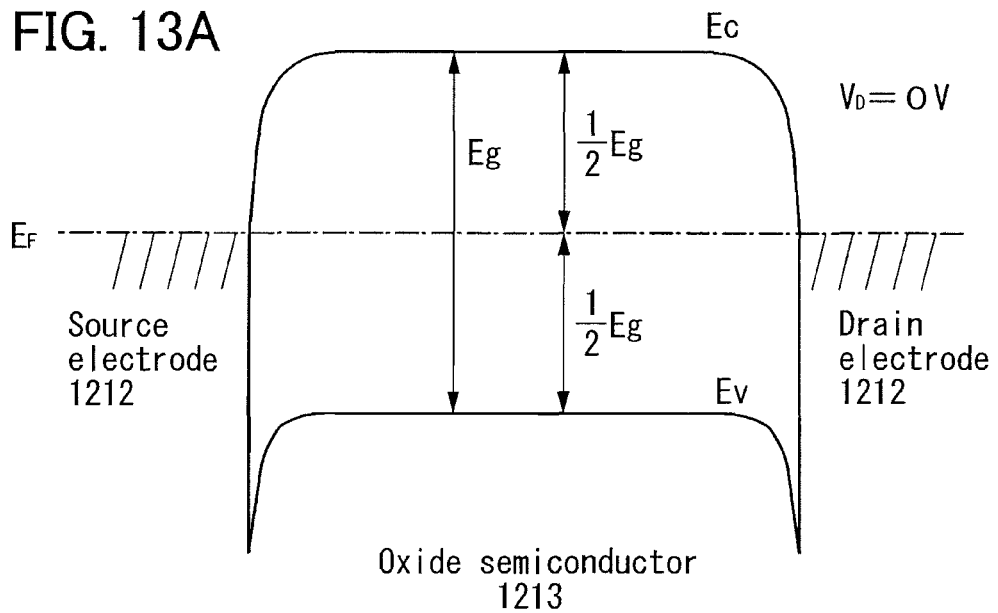
FIGS. 13A and 13B are energy band diagrams of a cross section showing one embodiment of the present invention.
Figure 13B:
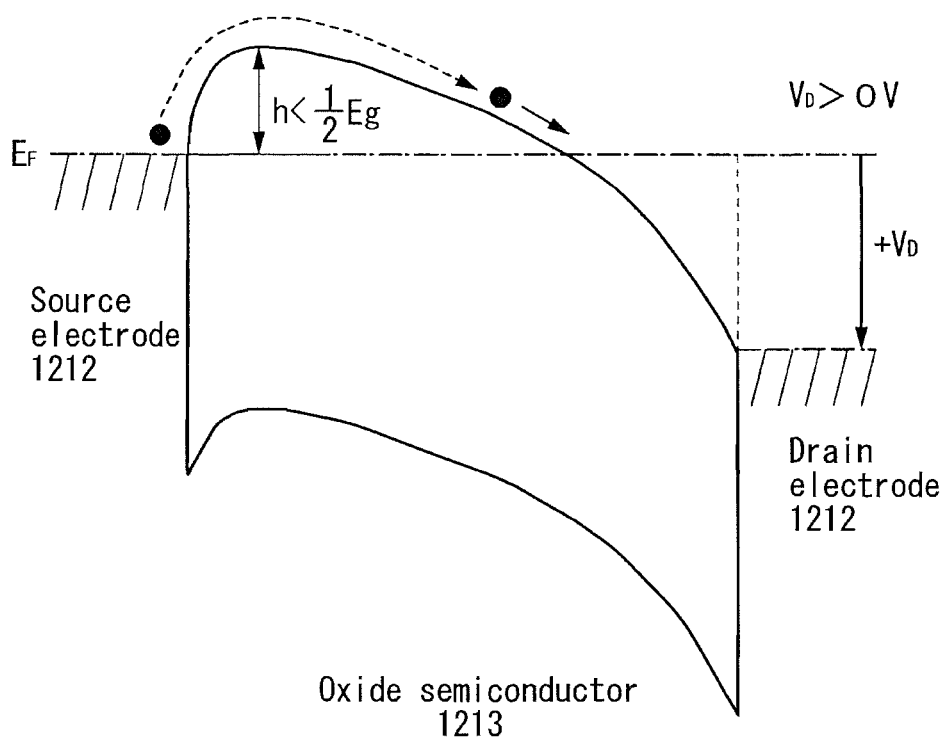

FIGS. 13A and 13B are energy band diagrams (schematic diagrams) of a cross section of the source and the drain which is obtained after the source and drain electrodes 1212 are formed in contact with the oxide semiconductor 1213. In FIG. 13B, a black circle (●) represents an electron. When a positive potential is applied to the drain electrode, the electrons cross a barrier to be injected into the oxide semiconductor and flow toward the drain electrode. In that case, the height of the barrier (h) changes depending on the gate voltage and the drain voltage. In the case where positive drain voltage is applied, the height of the barrier (h) is smaller than the height of the barrier (h) in FIG. 13A of the case where no voltage is applied; that is, the height of the barrier (h) is smaller than half of the band gap (Eg).

In this case, as shown in FIG. 16A, the electron moves along the lowest part of the oxide semiconductor, which is energetically stable, at the interface between the gate insulating film and the highly-purified oxide semiconductor.

In FIG. 16B, when a negative potential is applied to the gate electrode 1214, the number of holes that are minority carriers is substantially zero; thus, the current value becomes a value extremely close to zero.

For example, even when the thin film transistor has a channel width W of $1 \times 10^4$ µm and a channel length of 3 µm, an off current of $10^{-13}$ A or lower and a subthreshold value (S value) of 0.1 V/dec. (the thickness of the gate insulating film: 100 nm) can be obtained. In this manner, the oxide semiconductor contains an impurity other than the main component of the oxide semiconductor as few as possible to be highly purified, whereby the operation of the thin film transistor can be favorable. In particular, the off current can be reduced.

When the source and drain electrodes 1212 and the oxide semiconductor 1213 are brought in contact with each other, the Fermi level ($E_F$) of the source and drain electrodes 1212 and that of the oxide semiconductor 1213 are the same. At this time, an electron moves to the oxide semiconductor 1213 from the source and drain electrodes 1212, so that curves of the bands illustrated in FIGS. 13A and 13B are generated. FIG. 13A is an energy band diagram (a schematic diagram) of a cross section of the source and the drain which is obtained after the source and drain electrodes 1212 are formed in contact with the oxide semiconductor 1213. Note that FIG. 13A shows the case where the source electrode and the drain electrode have the same potential ($V_D=0$). FIG. 13B shows the case where a positive potential ($V_D>0$) with respect to the source electrode is applied to the drain electrode.

As described above, in a stacked layer of the source and drain electrode layers, a metal whose work function ($\phi_M$) is lower than the work function of the oxide semiconductor ($\phi_{MS}$) or an alloy containing such a metal is used as a material of a layer in contact with the oxide semiconductor. In this case, at the interface between the metal and the oxide semiconductor, the Schottky barrier for electrons is not formed; thus, the contact resistance can be small.

Therefore, a metal whose work function is lower than the work function of an oxide semiconductor or an alloy containing such a metal can also be used.

Note that the work function and the electron affinity of the oxide semiconductor can be measured by UPS (ultra-violet photoelectron spectroscopy) or the like. A stacked-layer structure including a metal whose work function is lower than the measured work function or electron affinity of the oxide semiconductor or an alloy containing such a metal is employed, whereby the contact resistance can be small.

Note that the work function refers to a difference in energy between the vacuum level ($E_\infty$) and the Fermi level ($E_F$). Note that an impurity such as hydrogen or water is eliminated from an oxide semiconductor according to the present invention as much as possible, so that the oxide semiconductor is highly purified to be an i-type semiconductor (an intrinsic semiconductor) or to be close thereto; therefore, the work function of the oxide semiconductor and the energy difference between the vacuum level ($E_\infty$) and the intrinsic Fermi level ($E_i$) of the oxide semiconductor are substantially the same. In FIG. 12, $E_v$ denotes the energy level at the upper end of the valence band of the oxide semiconductor.

This embodiment can be implemented in combination with any of the other embodiments.

Embodiment 2

In this embodiment, a stacked-layer structure in which an oxide semiconductor layer and a metal whose work function is lower than the electron affinity of the oxide semiconductor layer or an alloy containing such a metal are in contact with each other will be described.

For example, it is said that the electron affinity ($\chi$) of an In—Ga—Zn—O-based oxide semiconductor film is 4.3 eV in the case where the band gap (Eg) thereof is 3.15 eV. At this time, as a material which is used for source and drain electrode layers and whose work function is lower than 4.3 eV, yttrium, indium, aluminum, or the like can be given as shown in Table 1. Alternatively, an alloy containing a metal whose work function is lower than 4.3 eV may be used.

As an oxide semiconductor, for example, an In—Ga—Zn—O-based non-single-crystal film (IGZO) can be given. The electron affinity of IGZO is 4.3 eV. In the case where IGZO is used as a material of the source and drain electrode layers, a metal whose work function is lower than 4.3 eV such as yttrium, indium, or aluminum as shown in Table 1 may be used. In particular, yttrium is preferably used because yttrium has a low work function of 3.3 eV. Alternatively, an alloy containing a metal whose work function is lower than 4.3 eV may be used.

A metal whose work function is lower than the electron affinity of an oxide semiconductor is used as described above, whereby the contact resistance between the oxide semiconductor and the metal can be small.

Figure 14:
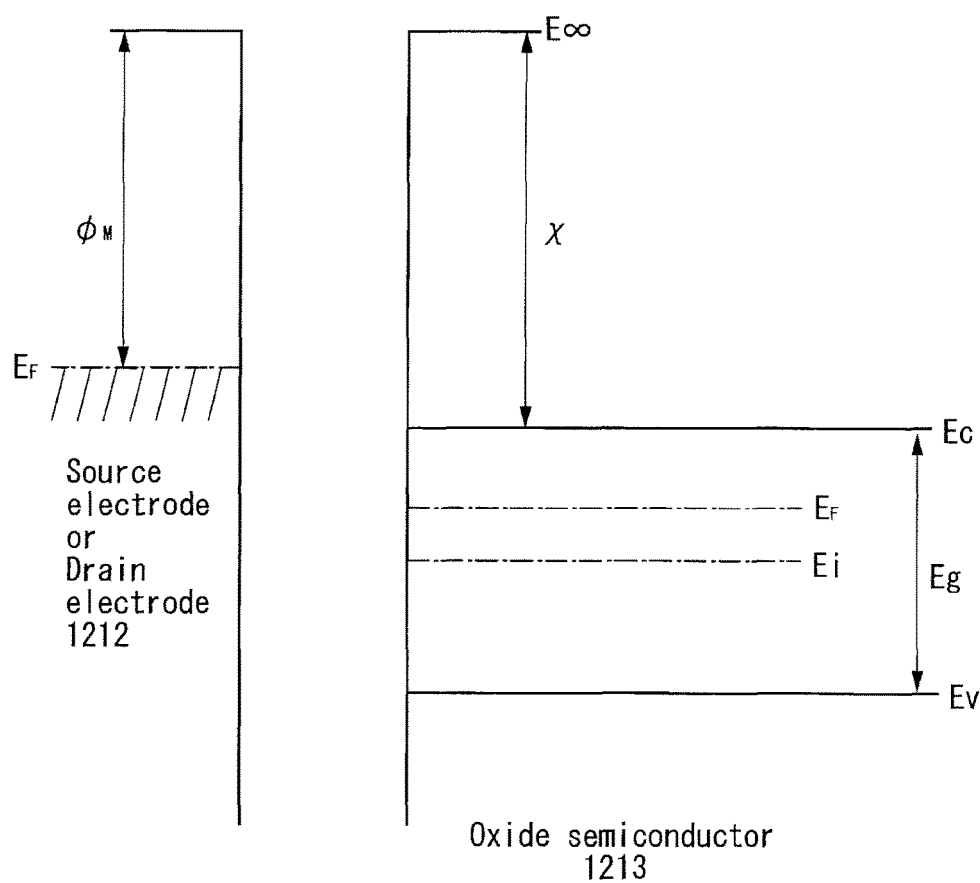
FIG. 14 is an energy band diagram showing one embodiment of the present invention.

FIG. 14 shows the relation between the work function ($\phi_M$) of source and drain electrodes 1212 and the electron affinity ($\chi$) of an oxide semiconductor 1213 before the source and drain electrodes 1212 and the oxide semiconductor 1213 are brought in contact with each other. FIG. 14 shows the case where the work function ($\phi_M$) of the source and drain electrodes 1212 is lower than the electron affinity ($\chi$) of the oxide semiconductor 1213.

At normal temperature, electrons in a metal are degenerated, and the Fermi level is located in the conduction band. On the other hand, a conventional oxide semiconductor is generally of n-type, and the Fermi level ($E_F$) in that case is positioned closer to the conduction band and is away from the intrinsic Fermi level ($E_i$) that is located in the middle of the band gap (Eg). Note that it is known that some hydrogen in the oxide semiconductor form a donor and might be a factor that causes an oxide semiconductor to be an n-type oxide semiconductor.

In contrast, an oxide semiconductor is made to be an intrinsic (i-type) semiconductor or made to be a substantially intrinsic semiconductor by being highly purified by removal of hydrogen that is an n-type impurity so that an impurity other than a main component of the oxide semiconductor is prevented from being contained therein as much as possible. In other words, the oxide semiconductor according to the present invention has a feature in that it is made to be an i-type (intrinsic) semiconductor or made to be close thereto not by addition of an impurity but by being highly purified by removal of an impurity such as hydrogen or water as much as possible. As a result, the Fermi level ($E_f$) can be at the same level as the intrinsic Fermi level ($E_i$).

FIGS. 16A and 16B are energy band diagrams (schematic diagrams) of a cross section of the oxide semiconductor 1213 and a gate electrode 1214 (i.e., a cross section perpendicular to a cross section of the source and the drain which will be described later) according to the present invention. FIG. 16A shows a state where a positive potential ($+V_G$) is applied to the gate electrode 1214, that is, a case where the thin film transistor is in an on state where carriers (electrons) flow between the source electrode and the drain electrode. FIG. 16B shows a state where a negative potential ($-V_G$) is applied to the gate electrode 1214, that is, a case where the thin film transistor is in an off state (where minority carriers do not flow). Note that GI denotes a gate insulating film.

Figure 15A:
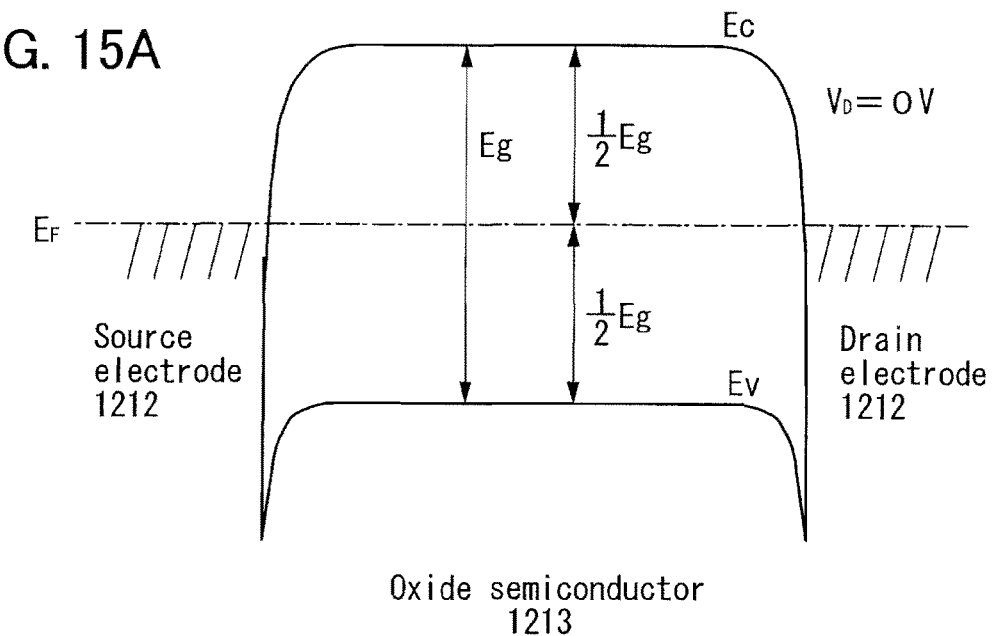
FIGS. 15A and 15B are energy band diagrams of a cross section showing one embodiment of the present invention.
Figure 15B:
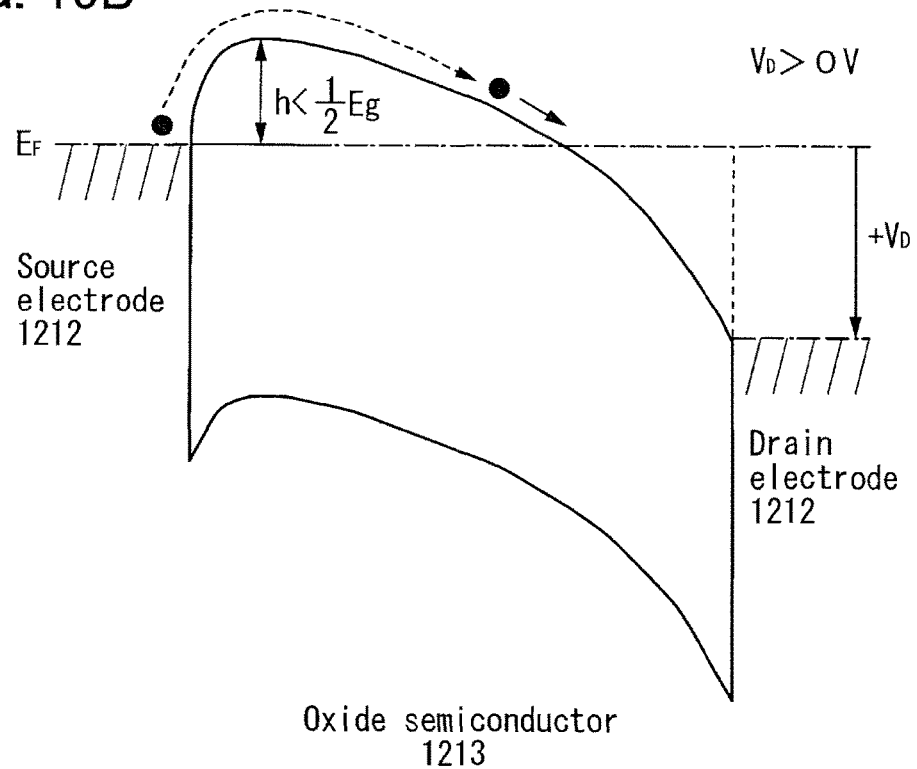

FIGS. 15A and 15B are energy band diagrams (schematic diagrams) of a cross section of the source and the drain which is obtained after the source and drain electrodes 1212 are formed in contact with the oxide semiconductor 1213. In FIG. 15B, a black circle (●) represents an electron. When a positive potential is applied to the drain electrode, the electrons cross a barrier to be injected into the oxide semiconductor and flow toward the drain electrode. In that case, the height of the barrier (h) changes depending on the gate voltage and the drain voltage. In the case where positive drain voltage is applied, the height of the barrier (h) is smaller than the height of the barrier (h) in FIG. 15A of the case where no voltage is applied; that is, the height of the barrier (h) is smaller than half of the band gap (Eg).

In this case, as shown in FIG. 16A, the electron moves along the lowest part of the oxide semiconductor, which is energetically stable, at the interface between the gate insulating film and the highly-purified oxide semiconductor.

In FIG. 16B, when a negative potential is applied to the gate electrode 1214, the number of holes that are minority carriers is substantially zero; thus, the current value becomes a value extremely close to zero.

For example, even when the thin film transistor has a channel width W of $1 \times 10^4$ μm and a channel length of 3 μm, an off current of $10^{-13}$ A or lower and a subthreshold value (S value) of 0.1 V/dec. (the thickness of the gate insulating film: 100 nm) can be obtained. In this manner, the oxide semiconductor contains an impurity other than the main component of the oxide semiconductor as few as possible to be highly purified, whereby the operation of the thin film transistor can be favorable. In particular, the off current can be reduced.

When the source and drain electrodes 1212 and the oxide semiconductor 1213 are in contact with each other, the Fermi level ($E_f$) of the source and drain electrodes 1212 and that of the oxide semiconductor 1213 are the same. At this time, an electron moves to the oxide semiconductor 1213 from the source and drain electrodes 1212, so that curves of the bands illustrated in FIGS. 15A and 15B are generated. FIG. 15A is an energy band diagram (a schematic diagram) of a cross section of the source and the drain which is obtained after the source and drain electrodes 1212 are formed in contact with the oxide semiconductor 1213. Note that FIG. 15A shows the case where the source electrode and the drain electrode have the same potential ($V_D=0$). FIG. 15B shows the case where a positive potential ($V_D>0$) with respect to the source electrode is applied to the drain electrode.

As described above, in a stacked layer of the source and drain electrode layers, a metal whose work function ($\phi_M$) is lower than the electron affinity of the oxide semiconductor ($\chi$) or an alloy containing such a metal is used as a material of a layer in contact with the oxide semiconductor. In this case, at the interface between the metal and the oxide semiconductor, the Schottky barrier for electrons is not formed; thus, the contact resistance can be small. Note that the lower the work function ($\phi_M$) of the source and drain electrode layers 1212 is, the less the Schottky barrier is likely to be formed.

Therefore, a metal whose work function is lower than the electron affinity of an oxide semiconductor or an alloy containing such a metal can also be used.

Since the metal degenerates, the electron affinity and the work function are the same.

Note that the work function and the electron affinity of the oxide semiconductor can be measured by UPS (ultra-violet photoelectron spectroscopy) or the like. A stacked-layer structure including a metal whose work function is lower than the measured work function or electron affinity of the oxide semiconductor or an alloy containing such a metal is employed, whereby favorable connection structure can be achieved.

Note that the electron affinity refers to a difference in energy between the vacuum level ($E_\infty$) and an end of the conduction band ($E_c$). In FIG. 14, $E_v$ denotes the energy level at the upper end of the valence band of the oxide semiconductor.

This embodiment can be implemented in combination with any of the other embodiments.

Embodiment 3

In this embodiment, one embodiment of a method for manufacturing a thin film transistor 150 illustrated in FIG. 1D will be described with reference to FIGS. 1A to 1D which are cross-sectional views illustrating a manufacturing process of a thin film transistor. The thin film transistor 150 is a kind of bottom-gate transistor.

It is preferable that a glass substrate be used as the substrate 100. When the temperature of heat treatment performed later is high, a glass substrate having a strain point of higher than or equal to 730° C. is preferably used as the substrate 100. Further, as a material of the glass substrate 100, for example, a glass material such as aluminosilicate glass, aluminoborosilicate glass, or barium borosilicate glass is used. Note that, generally, by containing more barium oxide (BaO) than boron oxide ($B_2O_3$), a more practical heat-resistant glass substrate can be obtained. Therefore, a glass substrate containing more BaO than $B_2O_3$ is preferably used.

Note that a substrate formed of an insulator such as a ceramic substrate, a quartz glass substrate, a quartz substrate, or a sapphire substrate may be used instead of the glass substrate. Alternatively, crystallized glass or the like may be used.

Further, an insulating layer serving as a base layer may be provided between the substrate 100 and the gate electrode layer 101. The base layer has a function of preventing diffusion of an impurity element from the substrate 100, and can be formed to have a single-layer or stacked-layer structure using one or more of a silicon nitride film, a silicon oxide film, a silicon nitride oxide film, and a silicon oxynitride film.

A metal conductive layer can be used as the gate electrode layer 101. As a material of the metal conductive layer, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure or a stacked-layer structure of two or more layers.

Next, a gate insulating layer 102 is formed over the gate electrode layer 101.

In this embodiment, the gate insulating layer 102 is formed using a high-density plasma apparatus. Here, a high-density plasma apparatus refers to an apparatus which can realize a plasma density higher than or equal to $1\times10^{11}$/$cm^3$. For example, plasma is generated by applying a microwave power higher than or equal to 3 kW and lower than or equal to 6 kW so that an insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate having an insulating surface, such as a glass substrate. After that, the supply of a monosilane gas is stopped, and nitrous oxide ($N_2O$) and a rare gas are introduced without exposure to air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has a small thickness and corresponds to an insulating film whose reliability can be ensured even when it has a thickness less than 100 nm, for example.

In forming the gate insulating layer 102, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed using the high-density plasma apparatus can have a uniform thickness, the insulating film has excellent step coverage. Further, as for the insulating film formed using the high-density plasma apparatus, the thickness of a thin film can be controlled precisely.

The insulating film formed through the above process procedure is greatly different from the insulating film formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating film formed using the high-density plasma apparatus is a dense film.

In this embodiment, a silicon oxynitride film (also referred to as $SiO_xN_y$, where x>y>0) with a thickness of 100 nm formed using the high-density plasma apparatus is used as the gate insulating layer 102.

Next, over the gate insulating layer 102, an oxide semiconductor layer is formed to a thickness greater than or equal to 5 nm and less than or equal to 200 nm, preferably greater than or equal to 10 nm and less than or equal to 50 nm. Further, the oxide semiconductor layer can be formed by a sputtering method under a rare gas (typically argon) atmosphere, an oxygen atmosphere, or an atmosphere containing a rare gas (typically argon) and oxygen.

The oxide semiconductor layer is formed using an In—Ga—Zn—O-based non-single-crystal layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an In—Sn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, for example, the oxide semiconductor film is formed by a sputtering method with use of an In—Ga—Zn—O-based oxide semiconductor target.

Here, an In—Ga—Zn—O-based non-single-crystal film having a thickness of 30 nm is formed using a metal oxide target containing In, Ga, and Zn ($In_2O_3:Ga_2O_3:ZnO=1:1:1$ in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%).

It is preferable that the relative density of the oxide semiconductor in the metal oxide target is 80% or more, more preferably 95% or more, further preferably 99.9% or more. The impurity concentration in an oxide semiconductor film which is formed using a target having high relative density can be reduced, and thus a thin film transistor having high electrical characteristics and high reliability can be obtained.

Preheat treatment is preferably performed so as to remove moisture or hydrogen remaining on an inner wall of a sputtering apparatus, on a surface of the target, or in a target material, before the oxide semiconductor film is formed. As the preheat treatment, a method in which the inside of the deposition chamber is heated to 200° C. to 600° C. under reduced pressure, a method in which introduction and exhaust of nitrogen or an inert gas are repeated while the inside of the deposition chamber is heated, and the like can be given. In this case, not water but oil or the like is preferably used as a coolant for the target. Although a certain level of effect can be obtained when introduction and exhaust of nitrogen are repeated without heating, it is more preferable to perform the treatment while the inside of the deposition chamber is heated. After the preheat treatment, the substrate or the sputtering apparatus is cooled, and then the oxide semiconductor film is formed.

In addition, the substrate may be heated to 400° C. to 700° C. during the deposition by a sputtering method.

It is preferable to remove moisture or the like remaining in the sputtering apparatus with the use of a cryopump before, during, or after the oxide semiconductor film is formed.

The gate insulating layer 102 and the oxide semiconductor film are preferably formed successively without exposure to air. By formation without exposure to air, each interface of the stacked layers can be formed without being contaminated by an atmospheric component or an impurity element floating in the air, such as water or hydrocarbon. Therefore, variation in characteristics of thin film transistors can be reduced.

Figure 1A:
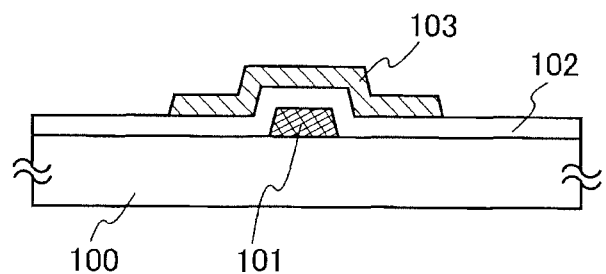
FIGS. 1A to 1D are cross-sectional views illustrating one embodiment of the present invention.

Next, the oxide semiconductor layer is processed into an island-shaped oxide semiconductor layer 103 by a photolithography step (see FIG. 1A). A resist mask for forming the island-shaped oxide semiconductor layer may be formed by an inkjet method. A photomask is not used when the resist mask is formed by an inkjet method, which results in reducing manufacturing cost.

Then, first heat treatment is performed for dehydration or dehydrogenation of the oxide semiconductor layer 103. The highest temperature during the first heat treatment for dehydration or dehydrogenation is set to 350° C. to 750° C., preferably 425° C. or higher. Note that in the case of the temperature that is 425° C. or higher, the heat treatment time may be one hour or shorter, whereas in the case of the temperature lower than 425° C., the heat treatment time is longer than one hour. In this embodiment, heat treatment is performed at 450° C. for one hour in a nitrogen atmosphere.

Note that in the first heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be set to 6N (99.9999%) or higher, preferably 7N (99.99999%) or higher (that is, the impurity concentration is 1 ppm or lower, preferably 0.1 ppm or lower).

The first heat treatment can be performed using a heating method with the use of an electric furnace. Note that the apparatus for the first heat treatment is not limited to the electric furnace and may be the one provided with a device for heating an object to be treated using heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be treated by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be treated by heat treatment, such as nitrogen or a rare gas like argon, is used.

Next, a stacked-layer structure of a conductive layer for forming a source electrode layer and a drain electrode layer is formed over the gate insulating layer 102 and the oxide semiconductor layer 103.

A stacked-layer structure of the conductive layer is formed in such a manner that an indium layer or an alloy layer containing indium with a thickness of greater than or equal to 1 nm and less than or equal to 50 nm is formed on and in contact with the oxide semiconductor layer 103, and a metal conductive layer formed using an element selected from Al, Cr, Cu, Ta, Ti, Mo, or W, an alloy containing any of these elements as a component, an alloy containing any of these elements in combination, or the like or a conductive layer formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added is stacked over the indium oxide layer or the alloy layer containing indium oxide.

In this embodiment, a stacked-layer structure of four layers in which a first molybdenum layer, an aluminum layer, and a second molybdenum layer are stacked over an alloy layer containing indium with a thickness of greater than or equal to 1 nm and less than or equal to 50 nm which is smaller than the thickness of the oxide semiconductor layer is employed. Deposition is performed in one multi-source sputtering apparatus in which a plurality of targets of different materials can be set, with the use of a first molybdenum target on which an indium pellet is put in an oxygen atmosphere. Next, four layers are successively stacked without exposure to air in one chamber with the use of a second molybdenum target on which an indium pellet is not put and an aluminum target. Note that the thickness of the alloy layer containing indium is the smallest among the four layers and is smaller than that of the oxide semiconductor layer. By successive deposition, increase in resistance of the thin alloy layer containing indium is prevented.

In this embodiment, an example in which an alloy layer containing indium is used as a layer in contact with the oxide semiconductor layer of a stacked-layer structure of the source electrode layer and the drain electrode layer is described; however, a metal whose work function is lower than at least the work function of the oxide semiconductor layer or an alloy containing such a metal such as zinc, an alloy containing zinc, yttrium, an alloy containing yttrium, titanium, an alloy containing titanium, or a compound containing gallium may be used.

In this embodiment, an example in which the source electrode layer and the drain electrode layer have a stacked-layer structure of a mixed layer containing indium and a metal conductive layer of an element selected from Al, Cr, Cu, Ta, Ti, Mo, or W, an alloy containing any of these elements as a component, an alloy containing any of these elements in combination, or the like is described; however, as illustrated in FIGS. 4A to 4D, mixed layers 115a and 115b (single layers) formed using a metal whose work function is lower than at least the work function of the oxide semiconductor layer or an alloy containing such a metal may be employed.

In the case of FIGS. 4A to 4D, a stacked-layer structure is employed in which a metal whose work function is lower than at least the work function of the oxide semiconductor, such as indium, an alloy containing indium, zinc, an alloy containing zinc, yttrium, an alloy containing yttrium, titanium, an alloy containing titanium, or a compound containing gallium, or an alloy containing such a metal is used as a first layer, and an element selected from Al, Cr, Cu, Ta, Ti, Mo, or W or an alloy containing any of these elements as a component is used as a second layer. In the mixed layer, the first layer has a small thickness of greater than or equal to 1 nm and less than or equal to 50 nm. This mixed layer may be used for the source and drain electrode layers.

Figure 1B:
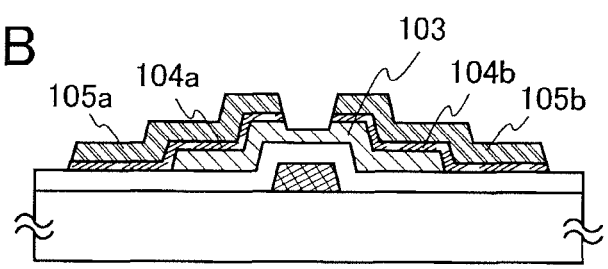

Next, the four-layer structure for forming the source and drain electrode layers is subjected to a photolithography step using a photomask to be selectively etched, and source electrode layers 104a and 105a and drain electrode layers 104b and 105b having a stacked-layer structure are formed (see FIG. 1B). Note that in the source and drain electrode layers, mixed layers containing indium on and in contact with the oxide semiconductor layer 103 correspond to layers denoted by reference numerals 104a and 104b. At this time, part of the oxide semiconductor layer 103 is also etched, and thus the oxide semiconductor layer 103 having a groove (depression) is formed. Note that depending on the material of the oxide semiconductor layer 103, the material of the source and drain electrode layers, and the etching conditions, a groove (depression) is not formed in the oxide semiconductor layer 103 in some cases.

Figure 1C:
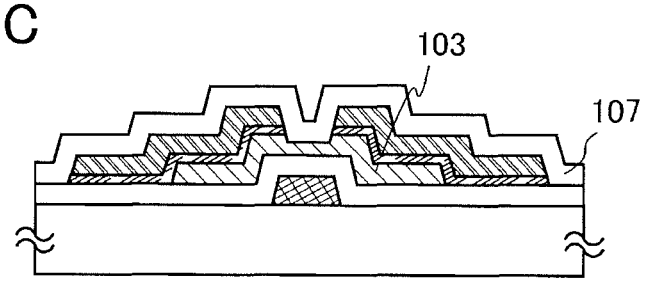

Next, a protective insulating layer 107 which covers the gate insulating layer 102, the oxide semiconductor layer 103, the source electrode layer 105a, and the drain electrode layer 105b and which is in contact with part of the oxide semiconductor layer 103 is formed (see FIG. 1C). The protective insulating layer 107 can be formed to a thickness of at least 1 nm or more using a method by which impurities such as water and hydrogen are prevented from being mixed to the protective insulating layer 107, such as a CVD method or a sputtering method, as appropriate. Here, the protective insulating layer 107 is formed by, for example, a reactive sputtering method which is one kind of sputtering method. The protective insulating layer 107 which is in contact with part of the oxide semiconductor layer 103 is formed using an inorganic insulating layer which does not contain impurities such as moisture, hydrogen ions, and OH⁻ and prevents entry of these impurities from the outside. Specifically, a silicon oxide layer, a silicon nitride oxide layer, a silicon nitride layer, an aluminum oxide layer, an aluminum oxynitride layer, or an aluminum nitride layer can be used.

Further alternatively, the protective insulating layer 107 may have a structure in which a silicon nitride layer or an aluminum nitride layer is stacked over a silicon oxide layer, a silicon nitride oxide layer, an aluminum oxide layer, or an aluminum oxynitride layer. In particular, the silicon nitride layer is preferable because it does not contain an impurity such as moisture, a hydrogen ion, or OH⁻ and prevents entry thereof from the outside.

The substrate temperature at the time of forming the protective insulating layer 107 may be set in the range of room temperature to 300° C. The silicon oxide layer can be formed by a sputtering method in a rare gas (typically, argon) atmosphere, an oxygen atmosphere, or an atmosphere containing a rare gas (typically, argon) and oxygen. As a target, a silicon oxide target or a silicon target can be used. For example, with the use of a silicon target, a silicon oxide layer can be formed by a sputtering method in an atmosphere containing oxygen and a rare gas. In this embodiment, a silicon oxide film having a thickness of 300 nm is formed using a silicon target.

Figure 1D:
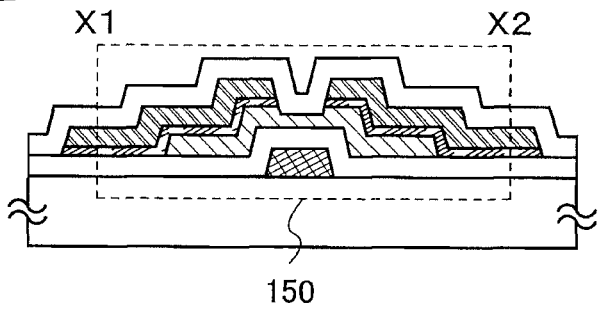

Through the above-described process, the bottom-gate thin film transistor 150 can be formed (see FIG. 1D). In the thin film transistor 150, the gate electrode layer 101 is provided over the substrate 100 which is a substrate having an insulating surface, the gate insulating layer 102 is provided over the gate electrode layer 101, the oxide semiconductor layer 103 is provided over the gate insulating layer 102, the stacked structure of the source electrode layers 104a and 105a and the drain electrode layers 104b and 105b are provided over the oxide semiconductor layer 103, and the protective insulating layer 107 which covers the gate insulating layer 102, the oxide semiconductor layer 103, the source electrode layers 104a and 105a, and the drain electrode layers 104b and 105b and which is in contact with part of the oxide semiconductor layer 103 is provided.

Figure 2:
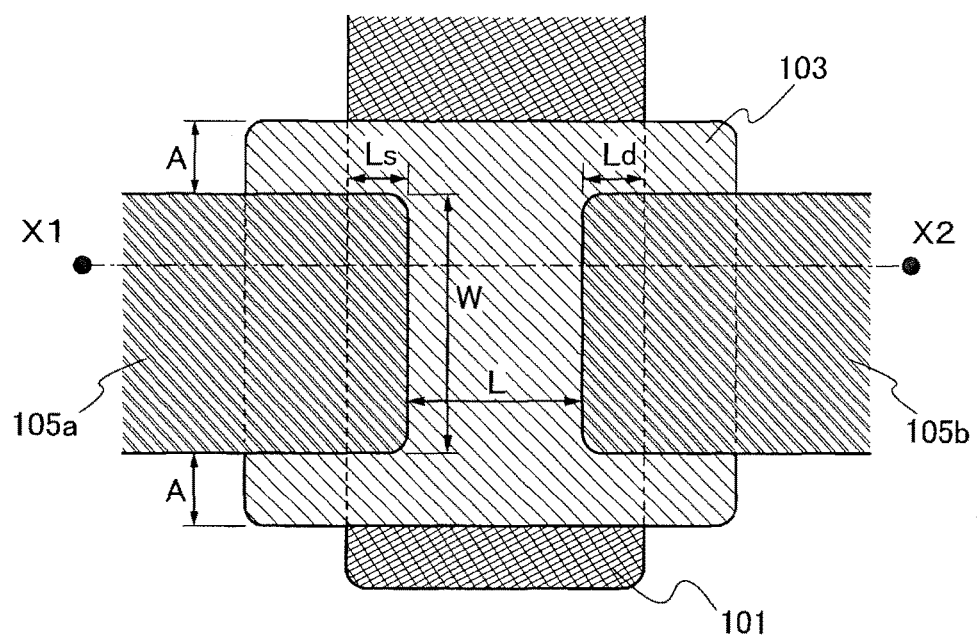
FIG. 2 is a top view illustrating one embodiment of the present invention.

FIG. 2 is a top view of the thin film transistor 150 described in this embodiment. FIG. 1D illustrates a cross-sectional structure taken along line X1-X2 in FIG. 2. In FIG. 2, L represents the channel length and W represents the channel width. In addition, A represents the length of a region where the oxide semiconductor layer 103 does not overlap with the source electrode layer 105a or the drain electrode layer 105b in a direction parallel to a channel width direction. Ls represents the length of part of the source electrode layer 105a which overlaps with the gate electrode layer 101, and Ld represents the length of part of the drain electrode layer 105b which overlaps with the gate electrode layer 101.

After a silicon oxide film having a thickness of 300 nm is formed as the protective insulating layer 107, second heat treatment is performed at a temperature in the range of 100° C. to 400° C. if necessary. In this embodiment, the substrate is heated at 150° C. for 10 hours. By this second heat treatment, a highly reliable thin film transistor can be formed.

In addition, the timing of the second heat treatment is not limited to being shortly after the formation of the protective insulating layer 107 and may be after a wiring or an electrode (such as a pixel electrode) is formed thereover.

Figure 3A:
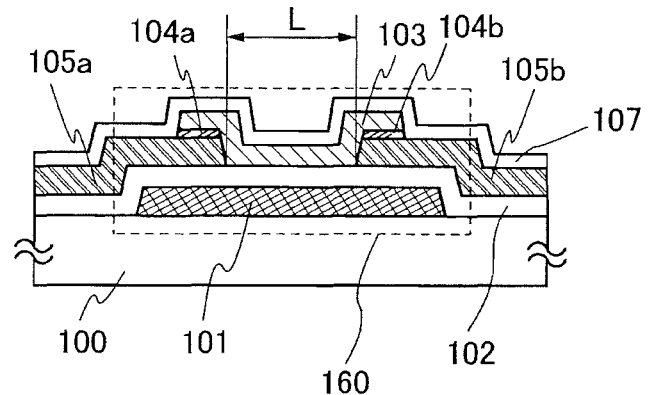
FIGS. 3A to 3C are cross-sectional views illustrating one embodiment of the present invention.
Figure 3B:
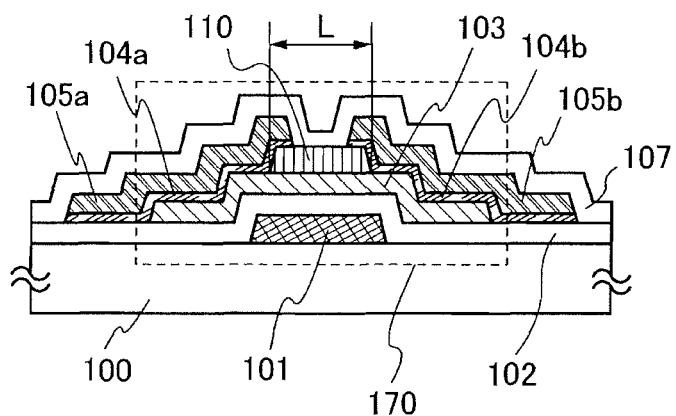
Figure 3C:
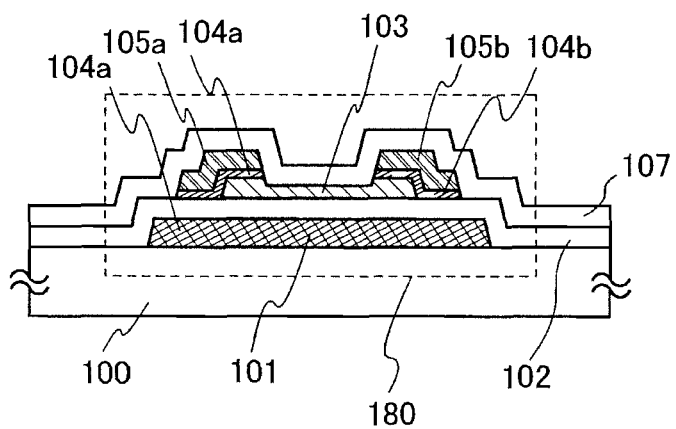
Figure 4A:
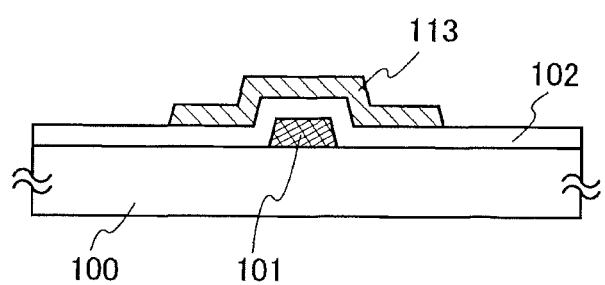
FIGS. 4A to 4D are cross-sectional views illustrating one embodiment of the present invention.
Figure 4B:
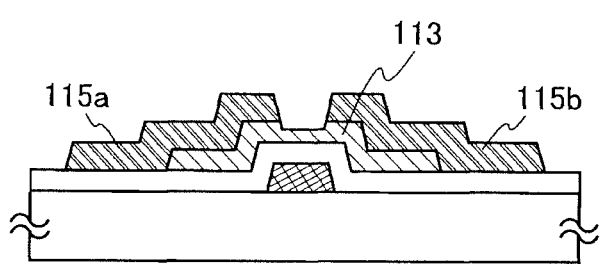
Figure 4C:
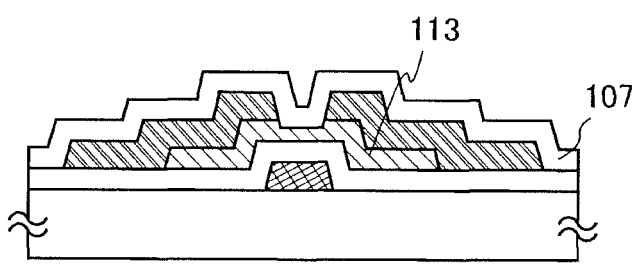
Figure 4D:
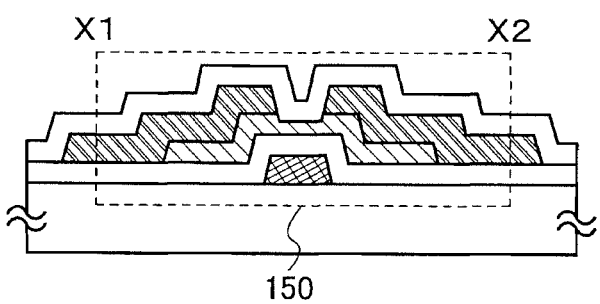

Although a method for manufacturing the bottom-gate thin film transistor 150 illustrated in FIG. 1D is described in this embodiment, the structure of this embodiment is not limited thereto. A thin film transistor 160 of a bottom-contact type (inverted-coplanar type) having a bottom-gate structure as illustrated in FIG. 3A, a thin film transistor 170 of a channel-protective type (also referred to as a channel-stop type) including a channel protective layer 110 as illustrated in FIG. 3B, or the like can also be formed using similar materials and similar methods. FIG. 3C illustrates another example of the channel-etched type thin film transistor. A thin film transistor 180 illustrated in FIG. 3C has a structure in which the gate electrode layer 101 extends to an outer side beyond an edge portion of the oxide semiconductor layer 103.

In order to reduce the number of photomasks and steps in a photolithography step, etching may be performed with the use of a resist mask formed a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed using a multi-tone mask. Thus, the number of light-exposure masks can be reduced and the number of corresponding photolithography steps can be also reduced, whereby simplification of a process can be realized.

Note that the channel length (L in FIG. 2) of the thin film transistor is defined as a distance between the source electrode layer 105a and the drain electrode layer 105b, and the channel length of the channel-protective thin film transistor is defined as the width of the channel protective layer in a direction parallel to a carrier flow direction.

In such a manner, with the use of a metal whose work function is lower than at least the work function of the oxide semiconductor, a semiconductor device in which the contact resistance between the oxide semiconductor and a metal is small can be formed.

This embodiment can be implemented in combination with any of the other embodiments.

Embodiment 4

In this embodiment, the case where thin film transistors are manufactured and a semiconductor device (also referred to as a display device) having a display function in which the thin film transistors are used for a pixel portion and a driver circuit is manufactured will be described. Further, the driver circuit can be formed over the same substrate as the pixel portion, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive layer to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having TAB tape or a TCP which is provided with a printed wiring board at the end thereof; and a module in which an integrated circuit (IC) is directly mounted on a display element by chip on glass (COG).

In this embodiment, an example of a liquid crystal display device is described as a semiconductor device which is one embodiment of the present invention. First, the appearance and a cross section of a liquid crystal display panel, which is one embodiment of a semiconductor device, will be described with reference to FIGS. 5A1, 5A2, and 5B. FIGS. 5A1 and 5A2 are each a top view of a panel in which thin film transistors 4010 and 4011 each including an In—Ga—Zn—O-based non-single-crystal layer, and a liquid crystal element 4013, which are formed over a first substrate 4001, are sealed between the first substrate 4001 and a second substrate 4006 with a sealant 4005. FIG. 5B is a cross-sectional view taken along line M-N of FIGS. 5A1 and 5A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the second substrate 4006, and the sealant 4005. A signal line driver circuit 4003 that is formed using a single crystal semiconductor or a polycrystalline semiconductor over a substrate separately prepared is mounted in a region different from the region surrounded by the sealant 4005 over the first substrate 4001.

Note that there is no particular limitation on the connection method of a driver circuit which is separately formed, and COG, wire bonding, TAB, or the like can be used. FIG. 5A1 illustrates an example of mounting the signal line driver circuit 4003 by COG, and FIG. 5A2 illustrates an example of mounting the signal line driver circuit 4003 by TAB.

The pixel portion 4002 and the scan line driver circuit 4004 provided over the first substrate 4001 each include a plurality of thin film transistors. FIG. 5B illustrates the thin film transistor 4010 included in the pixel portion 4002 and the thin film transistor 4011 included in the scan line driver circuit 4004. Protective insulating layers 4020 and 4021 are provided over the thin film transistors 4010 and 4011.

The thin film transistor including the oxide semiconductor layer which is described in Embodiment 1 can be used as each of the thin film transistors 4010 and 4011. Note that source electrode layers and drain electrode layers of the thin film transistors 4010 and 4011 are formed to have a stack-layer structure of a zinc layer and a tungsten layer, in which the zinc layer is in contact with the oxide semiconductor layer. In this embodiment, the thin film transistors 4010 and 4011 are n-channel thin film transistors.

A conductive layer 4040 is provided over part of the insulating layer 4021, which overlaps with an oxide semiconductor layer in the thin film transistor 4011 for the driver circuit. The conductive layer 4040 is provided in a position overlapping with the channel formation region of the oxide semiconductor layer, whereby the amount of change in threshold voltage of the thin film transistor 4011 before and after the BT test can be reduced. In addition, electrostatic blocking can be performed by provision of the conductive layer 4040 in a portion overlapping with the thin film transistor 4011 for a driver circuit, so that a normally-off thin film transistor can be obtained. Electrostatic blocking refers to blocking an electric field of the outside, that is, preventing action of an electric field of the outside on the inside (a circuit including TFT and the like).

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

After the insulating layer 4032 is formed, baking may be performed at 200° C. to 300° C.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A spacer 4035 is a columnar spacer obtained by selective etching of an insulating layer and is provided in order to control the distance between the pixel electrode layer 4030 and the counter electrode layer 4031 (a cell gap). Note that a spherical spacer may be used. In addition, the counter electrode layer 4031 is electrically connected to a common potential line formed over the same substrate as the thin film transistor 4010. Furthermore, with the use of a common connection portion, the counter electrode layer 4031 and the common potential line can be electrically connected to each other by conductive particles arranged between a pair of substrates. Note that the conductive particles are included in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of the cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal exhibiting a blue phase and a chiral agent has a short response speed of 1 msec or less, has optical isotropy, which makes the alignment process unneeded, and has a small viewing angle dependence.

When a liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity in manufacture of the liquid crystal display device can be increased. A thin film transistor which uses an oxide semiconductor layer particularly has a possibility that electrical characteristics of the thin film transistor may significantly change and deviate from the designed range by the influence of static electricity. Therefore, it is more effective to use a liquid crystal material exhibiting a blue phase for the liquid crystal display device including a thin film transistor which uses an oxide semiconductor layer.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of the manufacturing process. Furthermore, a light-blocking layer serving as a black matrix may be provided as needed.

In addition, in this embodiment, in order to reduce the surface roughness of the thin film transistor and to improve the reliability of the thin film transistor, the thin film transistor is covered with the insulating layer 4020 serving as a protective layer and the insulating layer 4021 serving as a planarization insulating layer. Note that the protective layer is provided to prevent entry of contaminant impurities such as organic substance, metal, or water vapor contained in the air and is preferably a dense film. The protective layer may be formed with a single layer or a stacked layer of a silicon oxide layer, a silicon nitride layer, a silicon oxynitride layer, a silicon nitride oxide layer, an aluminum oxide layer, an aluminum nitride layer, an aluminum oxynitride layer, and/or an aluminum nitride oxide layer by a sputtering method. An example in which the protective layer is formed by a sputtering method is described in this embodiment; however, there is no particular limitation on a method, and a variety of methods may be employed.

Here, the insulating layer 4020 having a stacked-layer structure is formed as the protective layer. Here, as a first layer of the insulating layer 4020, a silicon oxide layer is formed by a sputtering method. In the case where an aluminum layer is used for the source electrode layer and the drain electrode layer, the use of a silicon oxide layer for the protective layer provides an advantageous effect of preventing hillock of the aluminum layer used.

As a second layer of the insulating layer 4020, a silicon nitride layer is formed by a sputtering method. The use of the silicon nitride layer as the protective layer can prevent mobile ions such as sodium ions from entering a semiconductor region, thereby suppressing variations in electric characteristics of the TFT.

Next, the insulating layer 4021 is fed as the planarization insulating layer. As the insulating layer 4021, an organic material having heat resistance, such as polyimide, acrylic, benzocyclobutene, polyamide, or epoxy, can be used. Besides the above organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method of forming the insulating layer 4021. The insulating layer 4021 can be formed, depending on the material, by a method such as sputtering, an SOG method, a spin coating method, a dipping method, a spray coating method, a droplet discharge method (e.g., an inkjet method, screen printing, or offset printing), or a tool such as a doctor knife, a roll coater, a curtain coater, or a knife coater. In the case where the insulating layer 4021 is formed using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 Ω/square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. As examples thereof, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the thin film transistors 4010 and 4011. Accordingly, the terminal electrode 4016 has a stacked-layer structure of a zinc layer 4014 and a tungsten layer.

The connection terminal electrode 4015 is electrically connected to a terminal included in the FPC 4018 through an anisotropic conductive layer 4019.

FIGS. 5A1, 5A2, and 5B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

In addition, if necessary, a color filter is provided for each pixel. Furthermore, a polarizing plate or a diffusion plate is provided on the outer side of the first substrate 4001 and the second substrate 4006. Moreover, a liquid crystal display module is obtained using a cold cathode tube or an LED as a light source of a backlight.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above steps, a liquid crystal display device including a thin film transistor with excellent electric characteristics can be manufactured.

This embodiment can be implemented in combination with any of the other embodiments.

Embodiment 5

An example of an electronic paper will be described as one embodiment of a semiconductor device.

The thin film transistor described in Embodiment 1 can be used for an electronic paper in which electronic ink is driven by an element electrically connected to a switching element. The electronic paper is also called an electrophoretic display device (electrophoretic display) and has advantages in that it has the same level of readability as regular paper, less power consumption than other display devices, and can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high electric field region.

A solution in which the above microcapsules are dispersed in a solvent is referred to as electronic ink. This electronic ink can be applied to a surface of glass, plastic, cloth, paper, or the like by printing. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by using the thin film transistor described in Embodiment 1 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

Figure 6:
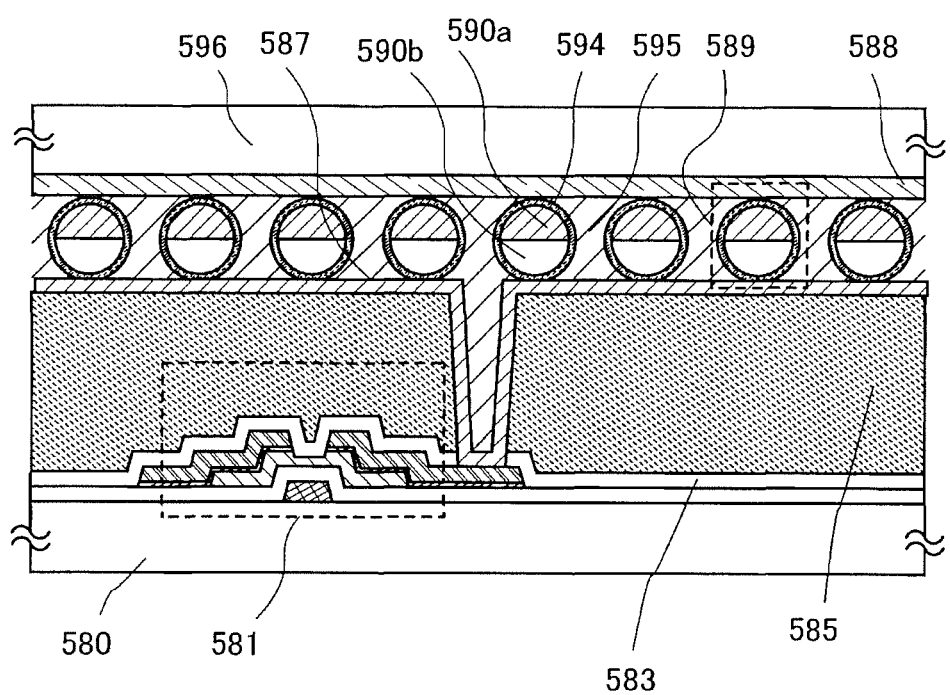
FIG. 6 is a cross-sectional view illustrating one embodiment of the present invention.

FIG. 6 illustrates an active matrix electronic paper as an example of a semiconductor device. A thin film transistor 581 used for the semiconductor device can be manufactured in a manner similar to the thin film transistor described in Embodiment 3, and includes stacks including indium layers in contact with an oxide semiconductor layer, as source and drain electrode layers.

The electronic paper in FIG. 6 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a bottom-gate thin film transistor and is covered with an insulating layer 583. A source or drain electrode layer of the thin film transistor 581 is electrically connected to a first electrode layer 587 through an opening formed in the insulating layer 583 and an insulating layer 585. Twisting balls 589 are provided between the first electrode layer 587 and a second electrode layer 588. Each of the twisting balls 589 includes a black region 590a, a white region 590b, and a cavity 594 filled with liquid around the black region 590a and the white region 590b. The circumference of the twisting balls 589 is filled with a filler 595 such as a resin (see FIG. 6). The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Further, instead of the twisting ball, an electrophoretic element can be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above steps, an electronic paper including a thin film transistor with excellent electric characteristics can be manufactured.

This embodiment can be implemented in combination with any of the other embodiments.

Embodiment 6

The appearance and a cross section of a light-emitting display panel (also referred to as a light-emitting panel) which corresponds to one embodiment of a semiconductor device according to the present invention will be described with reference to FIGS. 7A and 7B. FIG. 7A is a plan view of a panel in which a thin film transistor and a light-emitting element formed over a first substrate are sealed between the first substrate and a second substrate with a sealant. FIG. 7B is a cross-sectional view taken along line H-I of FIG. 7A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 7B.

For the thin film transistors 4509 and 4510, the thin film transistor described in Embodiment 3 can be employed. Note that each of source and drain electrode layers of the thin film transistors 4509 and 4510 has a stacked-layer structure of an alloy layer containing indium and a molybdenum layer. The alloy layer containing indium in this stacked-layer structure is in contact with an oxide semiconductor layer. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at least in a portion overlapping with a channel formation region of the oxide semiconductor layer, whereby the amount of change in threshold voltage of the thin film transistor 4509 before and after the BT test can be reduced. In addition, electrostatic blocking can be performed by provision of the conductive layer 4540 in a portion overlapping with the thin film transistor 4509 for the driver circuit, so that a normally-off thin film transistor can be obtained. The potential of the conductive layer 4540 may be the same as or different from that of a gate electrode layer of the thin film transistor 4509. The conductive layer 4540 can also function as a second gate electrode layer. In addition, the potential of the conductive layer 4540 may be GND or 0 V, or the conductive layer 4540 may be in a floating state.

In the thin film transistor 4509, an insulating layer 4541 is formed in contact with the semiconductor layer including the channel formation region, as a protective insulating layer. The insulating layer 4541 can be formed using a material and a method which are similar to those of the protective insulating layer 107 described in Embodiment 1. Moreover, the insulating layer 4544 functioning as a planarization insulating layer covers the thin film transistors in order to reduce surface unevenness caused by the thin film transistors. Here, as the insulating layer 4541, a silicon oxide layer is formed by a sputtering method using the protective insulating layer 107 in Embodiment 1.

The insulating layer 4544 is formed as the planarization insulating layer. The insulating layer 4544 may be formed using a material and a method which are similar to those of the insulating layer 4021 described in Embodiment 2. Here, acrylic is used for the insulating layer 4544. Instead of the insulating layer 4544, a color filter layer may be provided. When full color display is performed, for example, a light-emitting element 4511 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include a white light-emitting element as well as three kinds of light-emitting elements. A light-emitting display device capable of full color display may be manufactured in such a way that all of a plurality of light-emitting elements which is arranged is white light-emitting elements and a sealing substrate having a color filter or the like is arranged on the light-emitting element 4511. A material which exhibits a single color such as white is formed and combined with a color filter or a color conversion layer, whereby full color display can be performed. Needless to say, display of monochromatic light can also be performed. For example, a lighting system may be formed with the use of white light emission, or an area-color light-emitting device may be formed with the use of a single color light emission.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that although the light-emitting element 4511 has a stacked-layer structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on the direction in which light is extracted from the light-emitting element 4511, or the like.

A partition 4520 is formed using an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent oxygen, hydrogen, moisture, carbon dioxide, or the like from entering into the light-emitting element 4511. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive layer as the first electrode layer 4517 included in the light-emitting element 4511, and a terminal electrode 4516 is formed from the same conductive layer as the source and drain electrode layers included in the thin film transistors 4509 and 4510. Therefore, the terminal electrode 4016 has a stacked-layer structure of an alloy layer 4514 containing indium and a molybdenum layer.

The connection terminal electrode 4515 is electrically connected to a terminal included in the FPC 4518a through an anisotropic conductive layer 4519.

The substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor or a polycrystalline semiconductor over a substrate separately prepared. Alternatively, only the signal line driver circuits or part thereof, or the scan line driver circuits or part thereof may be separately formed and mounted. This embodiment is not limited to the structure illustrated in FIGS. 7A and 7B.

Through the above steps, a light-emitting display device (a display panel) including a thin film transistor with excellent electric characteristics can be manufactured.

This embodiment can be implemented in combination with any of the other embodiments.

Embodiment 7

A semiconductor device disclosed in this specification can be applied to a variety of electronic devices (including game machines). Examples of electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, a solar battery, and the like.

Figure 8A:
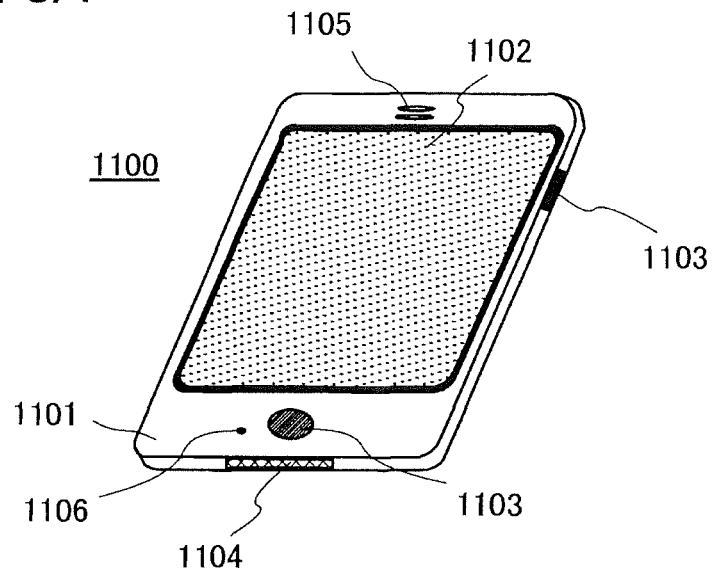
FIGS. 8A and 8B each illustrate an example of an electronic device.

FIG. 8A illustrates an example of a mobile phone. A mobile phone 1100 is provided with a display portion 1102 incorporated in a housing 1101, an operation button 1103, an external connection port 1104, a speaker 1105, a microphone 1106, and the like.

When the display portion 1102 of the mobile phone 1100 illustrated in FIG. 8A is touched with a finger or the like, data can be input into the mobile phone 1100. Further, operation such as making calls and texting can be performed by touching the display portion 1102 with a finger or the like.

There are mainly three screen modes of the display portion 1102. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, the text input mode mainly for inputting text is selected for the display portion 1102 so that characters displayed on a screen can be input. In that case, it is preferable to display a keyboard or number buttons on almost all area of the screen of the display portion 1102.

When a detection device including a sensor for detecting inclination, such as a gyroscope or an acceleration sensor, is provided inside the mobile phone 1100, display on the screen of the display portion 1102 can be automatically switched by determining the direction of the mobile phone 1100 (whether the mobile phone 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of image displayed on the display portion 1102. For example, when a signal of an image displayed on the display portion is a signal of moving image data, the screen mode is changed to the display mode. When the signal is a signal of text data, the screen mode is changed to the input mode.

Further, in the input mode, when input by touching the display portion 1102 is not performed for a certain period while a signal detected by an optical sensor in the display portion 1102 is detected, the screen mode may be controlled so as to be changed from the input mode to the display mode.

The display portion 1102 may function as an image sensor. For example, an image of a palm print, a fingerprint, or the like is taken when the display portion 1102 is touched with a palm or a finger, whereby personal identification can be performed. Further, by providing a backlight or a sensing light source which emits near-infrared light in the display portion, an image of a finger vein, a palm vein, or the like can be taken.

In the display portion 1102, a plurality of thin film transistors described in Embodiment 1 are provided as switching elements of pixels.

Figure 8B:
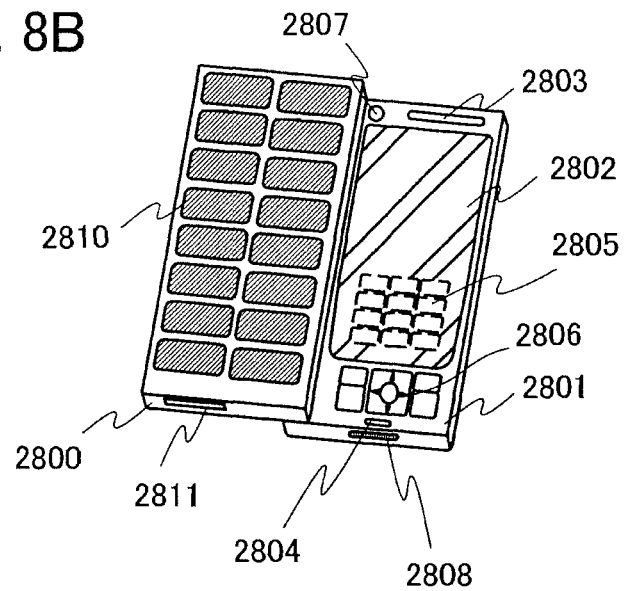

FIG. 8B illustrates another example of a mobile phone. A portable information terminal, one example of which is illustrated in FIG. 8B, can have a plurality of functions. For example, in addition to a telephone function, such a portable information terminal can have various data processing functions by incorporating a computer.

The portable information terminal illustrated in FIG. 8B is formed of a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with solar cells 2810 for charging the portable information terminal, an external memory slot 2811, and the like. In addition, an antenna is incorporated in the housing 2801.

Further, the display panel 2802 is provided with a touch panel. A plurality of operation keys 2805 which are displayed as images are illustrated by dashed lines in FIG. 8B.

Further, in addition to the above structure, a contactless IC chip, a small-sized memory device, or the like may be incorporated.

A light-emitting device can be used for the display panel 2802 and changes the direction of display as appropriate depending on an application mode. Since the camera lens 2807 is provided in the same plane as the display panel 2802, the portable information terminal can be used as a videophone. The speaker 2803 and the microphone 2804 can be used for operations such as video calls, sound recording, and playback without being limited to the voice call function. Moreover, the housings 2800 and 2801 in a state where they are developed as illustrated in FIG. 8B can be slid so that one is lapped over the other; therefore, the size of the portable information terminal can be reduced, which makes the portable information terminal suitable for being carried around.

The external connection terminal 2808 can be connected to an AC adaptor and a variety of cables such as a USB cable, and charging and data communication with a personal computer or the like are possible. Moreover, a recording medium can be inserted in the external memory slot 2811, and the portable information terminal can handle storage and transfer of a larger amount of data.

Further, in addition to the above functions, an infrared communication function, a television reception function, or the like may be provided.

Figure 9A:
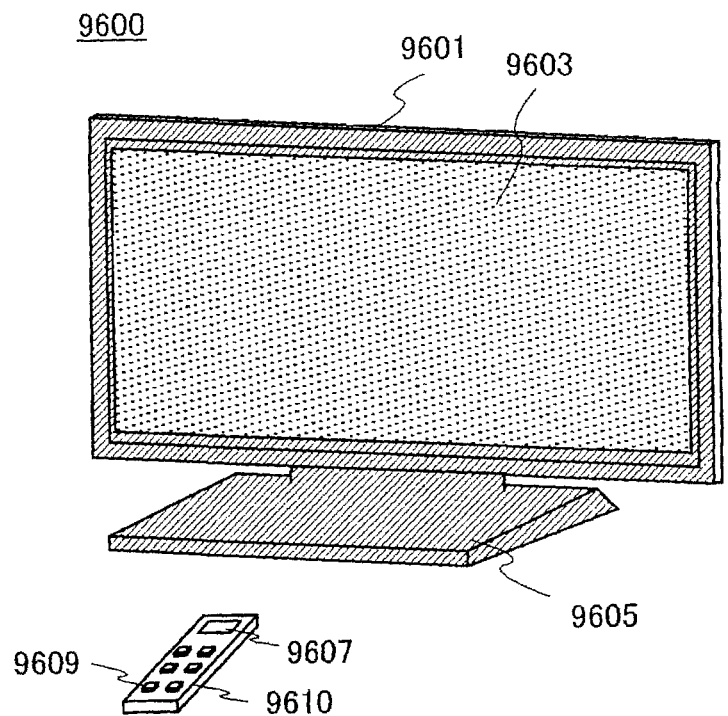
FIGS. 9A and 9B each illustrate an example of an electronic device.

FIG. 9A illustrates an example of a television device. In a television device 9600, a display portion 9603 is incorporated in a housing 9601. The display portion 9603 can display an image. Here, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the receiver, general television broadcasting can be received. Further, when the television device 9600 is connected to a communication network by wired or wireless connection via the modem, one-way (from a transmitter to a receiver) or two-way (between a transmitter and a receiver or between receivers) data communication can be performed.

In the display portion 9603, a plurality of thin film transistors described in Embodiment 1 are provided as switching elements of pixels.

Figure 9B:
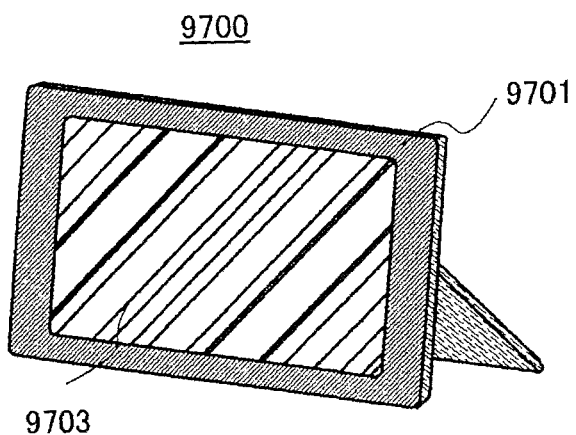

FIG. 9B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and can function like a normal photo frame.

In the display portion 9703, a plurality of thin film transistors described in Embodiment 1 are provided as switching elements of pixels.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 10:
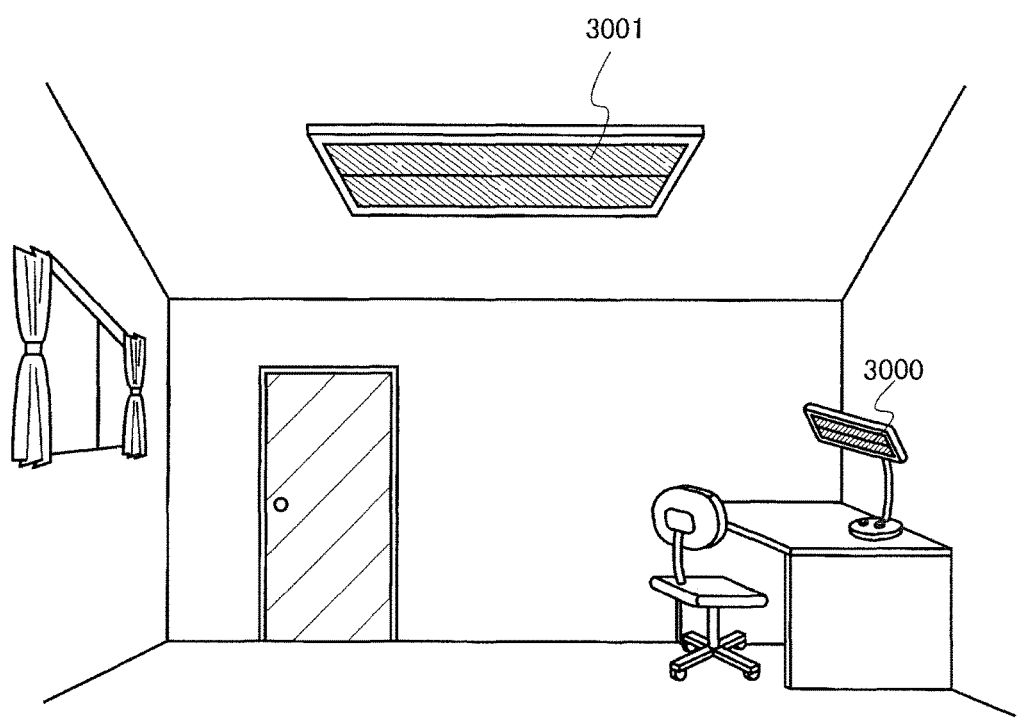
FIG. 10 illustrates examples of electronic devices.

FIG. 10 is an example in which the light-emitting device formed in accordance with Embodiment 4 is used as an indoor lighting device 3001. Since the light-emitting device described in Embodiment 4 can be increased in area, the light-emitting device can be used as a lighting device having a large area. Further, the light-emitting device described in Embodiment 4 can be used as a desk lamp 3000. Note that the lighting equipment includes in its category, a wall light, a lighting device for an inside of a vehicle, a guide light, and the like, as well as a ceiling light and a desk lamp.

In this manner, a thin film transistor according to one embodiment of the present invention can be provided in display panels of a variety of electronic devices as described above.

This embodiment can be implemented in combination with any of the other embodiments.

Embodiment 8

A semiconductor device disclosed in this specification can be applied to an electronic paper. An electronic paper can be used for electronic devices of a variety of fields as long as they can display data. For example, an electronic paper can be applied to an e-book reader (electronic book), a poster, an advertisement in a vehicle such as a train, or displays of various cards such as a credit card. An example of the electronic device is illustrated in FIG. 11.

Figure 11:
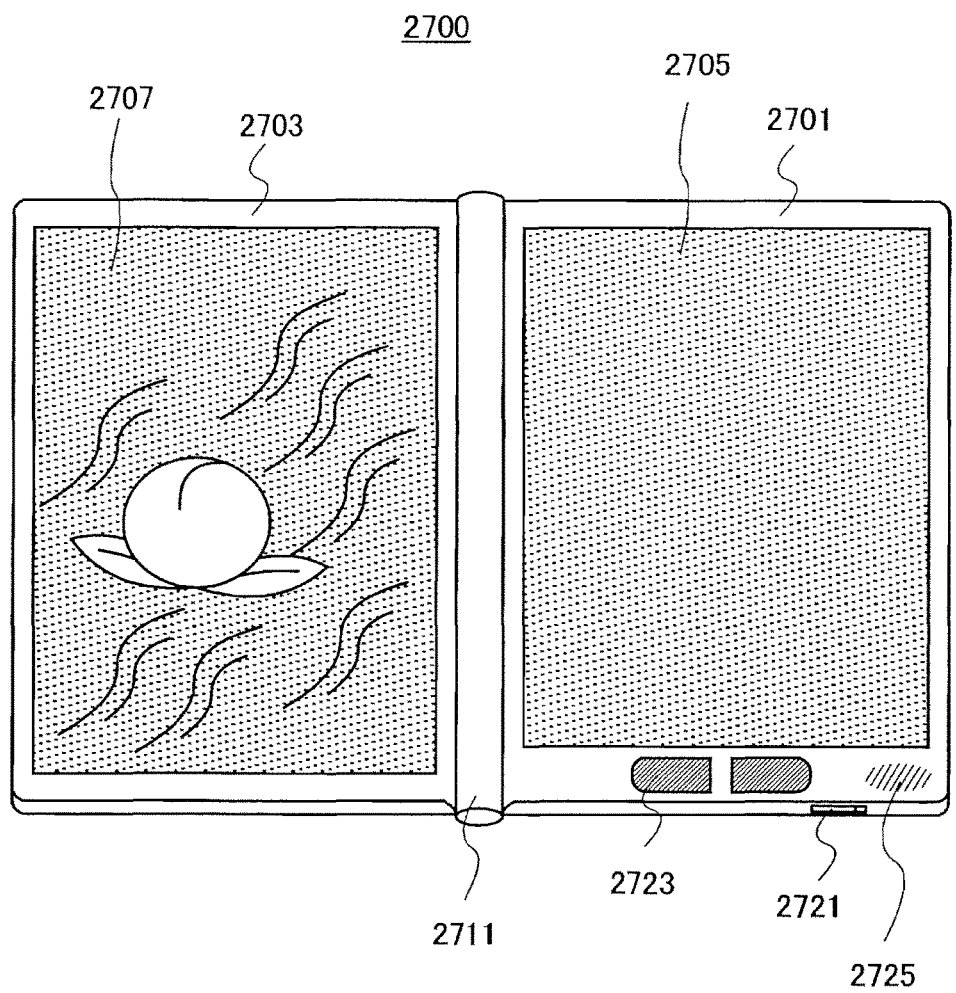
FIG. 11 illustrates an example of an electronic device.

FIG. 11 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 11) can display text and a display portion on the left side (the display portion 2707 in FIG. 11) can display graphics.

FIG. 11 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may transmit and receive data wirelessly. Through wireless communication, desired book data or the like can be purchased and downloaded from an electronic book server.

This embodiment can be implemented in appropriate combination with a thin film transistor according to one embodiment of the present invention or a structure of the electronic paper described in Embodiment 5.

This embodiment can be implemented in combination with any of the other embodiments.

This application is based on Japanese Patent Application serial no. 2009-255272 filed with Japan Patent Office on Nov. 6, 2009, the entire contents of which are hereby incorporated by reference.

EXPLANATION OF REFERENCE

100: substrate, 101: gate electrode layer, 102: gate insulating layer, 103: oxide semiconductor layer, 104*a*: source electrode layer, 104*b*: drain electrode layer, 105*a*: source electrode layer, 105*b*: drain electrode layer, 107: protective insulating layer, 110: channel protective layer, 150: thin film transistor, 160: thin film transistor, 170: thin film transistor, and 180: thin film transistor

The invention claimed is:

1. A method of manufacturing a semiconductor device comprising:
   forming a gate electrode over a substrate;
   forming a gate insulating layer over the gate electrode;
   forming an oxide semiconductor layer over the gate insulating layer by sputtering in a chamber, wherein the oxide semiconductor layer is non-single-crystal;
   performing a preheat treatment at 200 to 600° C. to remove moisture or hydrogen remaining on an inner wall of the chamber before forming the oxide semiconductor layer;
   cooling an oxide semiconductor target using non water based coolant; and
   removing moisture from an inside of the chamber by using a cryopump at least during the forming of the oxide semiconductor layer,
   wherein the substrate is heated during forming the oxide semiconductor layer.

2. The method according to claim 1, wherein the oxide semiconductor layer is intrinsic or substantially intrinsic.

3. The method according to claim 1, wherein the substrate is heated during the forming of the oxide semiconductor layer at a temperature of 400° C. to 700° C.

4. The method according to claim 1, wherein the oxide semiconductor layer comprises a material selected from the group consisting of an In—Ga—Zn—O-based material, an In—Sn—Zn—O-based oxide semiconductor material, an In—Al—Zn—O-based oxide semiconductor material, an In—Zn—O-based oxide semiconductor material, an In—Sn—O-based oxide semiconductor material, and an In—O-based oxide semiconductor material.

5. The method according to claim 1, further comprising steps of:

processing the oxide semiconductor layer into an island-shaped oxide semiconductor layer which includes a region to become a channel formation region; and forming a conductive layer on and in contact with the oxide semiconductor layer, wherein the conductive layer comprises a metal whose work function is lower than a work function of the oxide semiconductor layer.

6. A method of manufacturing a semiconductor device comprising:

forming a gate electrode over a substrate;

forming a gate insulating layer over the gate electrode;

forming an oxide semiconductor layer over the gate insulating layer by sputtering in a chamber, wherein the oxide semiconductor layer is non-single-crystal;

performing a preheat treatment at 200 to 600° C. to remove moisture or hydrogen remaining on an inner wall of the chamber before forming the oxide semiconductor layer;

cooling an oxide semiconductor target using non water based coolant;

removing moisture from an inside of the chamber by using a cryopump at least during forming the oxide semiconductor layer;

processing the oxide semiconductor layer into an island-shaped oxide semiconductor layer which includes a region to become a channel formation region; and heating the island-shaped oxide semiconductor layer at a temperature of 350° C. to 750° C.

7. The method according to claim 6, wherein the island-shaped oxide semiconductor layer is heated in an inert gas.

8. The method according to claim 6, wherein the island-shaped oxide semiconductor layer is heated in a nitrogen atmosphere.

9. The method according to claim 6, wherein the oxide semiconductor layer is intrinsic or substantially intrinsic.

10. The method according to claim 6, wherein the substrate is heated during the forming of the oxide semiconductor layer at a temperature of 400° C. to 700° C.

11. The method according to claim 6, wherein the oxide semiconductor layer comprises a material selected from the group consisting of an In—Ga—Zn—O-based material, an In—Sn—Zn—O-based oxide semiconductor material, an In—Al—Zn—O-based oxide semiconductor material, an In—Zn—O-based oxide semiconductor material, an In—Sn—O-based oxide semiconductor material, and an In—O-based oxide semiconductor material.

12. The method according to claim 6, further comprising step of:

forming a conductive layer on and in contact with the oxide semiconductor layer, wherein the conductive layer comprises a metal whose work function is lower than a work function of the oxide semiconductor layer.

13. A method of manufacturing a semiconductor device comprising:

forming a gate electrode over a substrate;

forming a gate insulating layer over the gate electrode;

forming an oxide semiconductor layer over the gate insulating layer by sputtering in a chamber, wherein the oxide semiconductor layer is non-single-crystal;

performing a preheat treatment at 200 to 600° C. to remove moisture or hydrogen remaining on an inner wall of the chamber before forming the oxide semiconductor layer;

removing moisture from an inside of the chamber by using a cryopump at least during forming the oxide semiconductor layer;

processing the oxide semiconductor layer into an island-shaped oxide semiconductor layer which includes a region to become a channel formation region;

performing a first heat treatment at a temperature of 350° C. to 750° C. after forming the island-shaped oxide semiconductor layer;

forming an insulating layer over the oxide semiconductor layer after performing the first heat treatment; and performing a second heat treatment at a temperature of 100° C. to 400° C. after forming the insulating layer.

14. The method according to claim 13, wherein the first heat treatment is performed in an inert gas.

15. The method according to claim 13, wherein the oxide semiconductor layer is intrinsic or substantially intrinsic.

16. The method according to claim 13, wherein the substrate is heated during the forming of the oxide semiconductor layer at a temperature of 400° C. to 700° C.

17. The method according to claim 13, wherein the oxide semiconductor layer comprises a material selected from the group consisting of an In—Ga—Zn—O-based material, an In—Sn—Zn—O-based oxide semiconductor material, an In—Al—Zn—O-based oxide semiconductor material, an In—Zn—O-based oxide semiconductor material, an In—Sn—O-based oxide semiconductor material, and an In—O-based oxide semiconductor material.

18. The method according to claim 13, further comprising step of:

forming a conductive layer on and in contact with the oxide semiconductor layer, wherein the conductive layer comprises a metal whose work function is lower than a work function of the oxide semiconductor layer.

19. The method according to claim 13, wherein the insulating layer comprises silicon oxide.

20. The method according to claim 13, wherein the insulating layer comprises aluminum oxide.

* * * * *